(12) United States Patent
Najafi

(10) Patent No.: US 10,944,403 B2
(45) Date of Patent: Mar. 9, 2021

(54) SUPERCONDUCTING FIELD-PROGRAMMABLE GATE ARRAY

(71) Applicant: PsiQuantum Corp., Palo Alto, CA (US)

(72) Inventor: Faraz Najafi, Palo Alto, CA (US)

(73) Assignee: PSIQUANTUM CORP., Palo Alto, CA (US)

(*) Notice: Subject to any disclaimer, the term of this patent is extended or adjusted under 35 U.S.C. 154(b) by 0 days.

(21) Appl. No.: 16/656,506

(22) Filed: Oct. 17, 2019

(65) Prior Publication Data

US 2020/0136625 A1 Apr. 30, 2020

Related U.S. Application Data

(60) Provisional application No. 62/751,601, filed on Oct. 27, 2018.

(51) Int. Cl.
*H03K 19/195* (2006.01)
*H03K 19/17784* (2020.01)
(Continued)

(52) U.S. Cl.
CPC ..... *H03K 19/195* (2013.01); *H03K 19/17728* (2013.01); *H03K 19/17744* (2013.01); *H03K 19/17784* (2013.01)

(58) Field of Classification Search
CPC ............. H03K 19/195; H03K 19/1952; H03K 19/1954; H03K 19/1956; H03K 19/1958;
(Continued)

(56) References Cited

U.S. PATENT DOCUMENTS 3,059,196 A * 10/1962 Lentz .................. H01L 39/18
338/32 R
3,119,076 A 1/1964 Schlig et al.
(Continued)

FOREIGN PATENT DOCUMENTS

CN 106289515 A 1/2017
CN 106549099 3/2017
(Continued)

OTHER PUBLICATIONS

Akhlaghi et al., "Gated Mode Superconducting Nanowire Single Photon Detectors," Optics Express, vol. 20, No. 2, Jan. 16, 2012, 9 pgs.
(Continued)

*Primary Examiner* — Kurtis R Bahr
(74) *Attorney, Agent, or Firm* — Morgan, Lewis & Bockius LLP

(57) ABSTRACT

The various embodiments described herein include methods, devices, and systems for operating superconducting circuitry. In one aspect, a programmable circuit includes: (1) a superconducting component arranged in a multi-dimensional array of alternating narrow and wide portions, the superconducting component having an input terminal at a first end and an output terminal at a second end opposite of the first end; and (2) control circuitry coupled to the narrow portions of the superconducting component, the control circuitry configured to transition the narrow portions between superconducting and non-superconducting states.

16 Claims, 29 Drawing Sheets

(51) Int. Cl.
*H03K 19/17736* (2020.01)
*H03K 19/17728* (2020.01)

(58) Field of Classification Search
CPC ....... H03K 19/17728; H03K 19/17744; H03K 19/17784
See application file for complete search history.

(56) References Cited

U.S. PATENT DOCUMENTS

| | | | |
|---|---|---|---|
| 4,336,561 A | 6/1982 | Murphy | |
| 4,365,317 A | 12/1982 | Gheewala | |
| 4,509,146 A | 4/1985 | Wang et al. | |
| 4,647,954 A | 3/1987 | Graf et al. | |
| 5,026,682 A | 6/1991 | Clark et al. | |
| 5,030,614 A | 7/1991 | Hollander et al. | |
| 5,030,617 A | 7/1991 | Legge | |
| 5,041,880 A | 8/1991 | Nojima et al. | |
| 5,051,787 A | 9/1991 | Hasegawa | |
| 5,173,620 A | 12/1992 | Fujimaki et al. | |
| 5,219,826 A * | 6/1993 | Kapitulnik | H01L 39/2496 216/3 |
| 5,247,475 A | 9/1993 | Hasunuma et al. | |
| 5,321,004 A * | 6/1994 | Perez | H01L 39/2496 257/33 |
| 5,365,476 A | 11/1994 | Mukhanov | |
| 5,376,626 A | 12/1994 | Drehman et al. | |
| 5,455,519 A | 10/1995 | Ohori | |
| 5,481,119 A * | 1/1996 | Higashino | H01L 39/18 257/34 |
| 5,521,862 A | 5/1996 | Frazier | |
| 5,574,290 A | 11/1996 | You | |
| 5,719,105 A * | 2/1998 | Odagawa | H01L 39/126 505/234 |
| 5,825,240 A | 10/1998 | Geis et al. | |
| 5,831,278 A | 11/1998 | Berkowitz | |
| 5,892,644 A | 4/1999 | Evans | |
| 5,925,892 A * | 7/1999 | Mizuno | H01L 39/225 257/31 |
| 6,029,075 A | 2/2000 | Das et al. | |
| 6,078,517 A | 6/2000 | Herr | |
| 6,242,939 B1 | 6/2001 | Nagasawa | |
| 6,433,974 B2 | 8/2002 | Heismann | |
| 6,774,463 B1 | 8/2004 | Chaudhari et al. | |
| 7,227,438 B2 | 6/2007 | Song et al. | |
| 7,513,765 B2 | 4/2009 | Liao | |
| 7,558,030 B2 | 7/2009 | Lee et al. | |
| 7,724,083 B2 | 5/2010 | Herring et al. | |
| 7,847,282 B2 | 12/2010 | Sandhu | |
| 7,852,106 B2 | 12/2010 | Herr et al. | |
| 8,330,145 B2 | 12/2012 | Wakana et al. | |
| 8,565,844 B2 | 10/2013 | Smith | |
| 8,577,430 B1 | 11/2013 | Smith | |
| 8,736,085 B2 | 5/2014 | Sines | |
| 9,293,240 B2 | 3/2016 | Kroulik | |
| 9,443,576 B1 | 9/2016 | Miller | |
| 9,500,519 B2 | 11/2016 | Tang et al. | |
| 9,509,315 B2 | 11/2016 | McCaughan et al. | |
| 9,876,505 B1 | 1/2018 | Dai et al. | |
| 9,998,122 B2 | 6/2018 | Hamilton et al. | |
| 10,103,736 B1 | 10/2018 | Powell et al. | |
| 10,171,086 B2 | 1/2019 | McCaughan et al. | |
| 10,177,298 B1 * | 1/2019 | Taylor | H01L 41/0986 |
| 10,186,858 B2 | 1/2019 | Klaus et al. | |
| 10,197,440 B2 | 2/2019 | Najafi | |
| 10,361,703 B2 | 7/2019 | Najafi | |
| 10,386,229 B2 | 8/2019 | Najafi et al. | |
| 10,396,733 B2 | 8/2019 | Najafi et al. | |
| 10,620,044 B2 | 4/2020 | Thompson et al. | |
| 2002/0149453 A1 | 10/2002 | Snitchler et al. | |
| 2005/0153843 A1 | 7/2005 | Kubota | |
| 2005/0197254 A1 | 9/2005 | Stasiak et al. | |
| 2010/0026447 A1 | 2/2010 | Keefe et al. | |
| 2010/0171098 A1 | 7/2010 | Suzuki | |
| 2011/0254053 A1 | 10/2011 | Goupil et al. | |
| 2013/0012392 A1 | 1/2013 | Tanaka et al. | |
| 2013/0143744 A1 | 6/2013 | Marsili et al. | |
| 2014/0113828 A1 | 4/2014 | Gilbert et al. | |
| 2014/0299751 A1 | 10/2014 | Tang et al. | |
| 2015/0018218 A1 | 1/2015 | Lakrimi et al. | |
| 2015/0179916 A1 | 6/2015 | Pramanik et al. | |
| 2016/0028402 A1 * | 1/2016 | McCaughan | H01L 39/125 505/193 |
| 2017/0186933 A1 | 6/2017 | Sunter et al. | |
| 2018/0145664 A1 | 5/2018 | Herr et al. | |
| 2019/0027672 A1 | 1/2019 | Megrant | |
| 2019/0035999 A1 | 1/2019 | Najafi | |
| 2019/0109595 A1 | 4/2019 | Najafi | |

FOREIGN PATENT DOCUMENTS

| | | |
|---|---|---|
| DE | 2440576 B1 | 1/1976 |
| EP | 0299879 A2 | 1/1989 |
| GB | 2530500 A | 3/2016 |
| JP | S 63299282 A | 12/1988 |
| JP | H 05-55647 A | 3/1993 |
| WO | WO 90/14715 A1 | 11/1990 |
| WO | WO 94/09566 A1 | 4/1994 |

OTHER PUBLICATIONS

Atikian, Haig A. et al., "Superconducting Nanowire Single Photon Detector on Diamond," arXiv:1401.4490v1, physics.optics, Jan. 17, 2014, 5 pgs.

Cheng, Risheng et al., "Photon-Number-Resolving Detector Based on Superconducting Serial Nanowires," IEEE Transactions on Applied Superconductivity, vol. 23, No. 1, Feb. 2013, 9 pgs.

Clem, John R. et al., "Geometry-dependent critical currents in superconducting nanocircuits," arXiv:1109.4881v1 [cond-mat.supr-con] Sep. 22, 2011, 29 pgs.

Dai, Daoxin et al., "Mode conversion in tapered submicron silicon ridge optical waveguides," Optics Express, vol. 20, No. 12, Jun. 4, 2012, 15 pgs.

Henrich, D. et al., "Geometry-inducted reduction of the critical current in superconducting nanowires," arXiv:1204.0616v2 [cond-mat-supr-con] Aug. 22, 2012, 6 pgs.

Hortensius, H.L. et al., "Critical-Current Reduction in Thin Superconducting Wires Due to Current Crowding," arXiv:1203.4253v3, [cond-mat-supr-con], May 6, 2012, 5 pgs.

Korzh, B.A. et al., "Demonstrating sub-3 ps temporal resolution in a superconducting nanowire single-photon detector," Apr. 18, 2018, 26 pgs.

Lee, S.-B. et al., "Fabrication of a self-aligned superconducting nanotransistor based NOR logic gate," Microelectronic Engineering 57-58, 2001, 7 pgs., downloaded from https://www.sciencedirect.com/science/article/abs/pii/S0167931701004269).

Marsili, F., "Single-photon detectors based on ultra-narrow superconducting nanowires," Massachusetts Institute of Technology, Department of Electrical Engineering and Computer Science, Dec. 19, 2010, 31 pgs.

Mattioli, Francesco et al., "Photon-number-resolving superconducting nanowire detectors," Superconductor Science and Technology, Aug. 24, 2015, 16 pgs.

McGaughan, "Superconducting thin film nanoelectronics," Sep. 2015, Massachusetts Institute of Technology, submitted to the Department of Electrical Engineering and Computer Science in partial fulfillment of the requirements for the degree of Doctor of Philosopy in Electrical Engineering, 22 pgs.

Murphy et al., "Nanoscale superconducting memory based on the kinetic inductance of asymmetric nanowire loops," Departmwent of Physics, University of Illinois at Urbana-Champaign, arXiv:1701.08715v2 [cond-mat.supr-con] Jun. 29, 2017, 19 pgs.

Natarajan et al., "Superconducting nanowire single-photon detectors: physics and applications", 2012, Superconduc. Sci. Technology vol. 25, p. 063001.

Quaranta et al., Superconductive Three-Terminal Amplifier/Discriminator, IEEE Transactions on Applied Superconductivity, vol. 19, No. 3, Jun. 2, 2009, 4 pgs.

(56) References Cited

OTHER PUBLICATIONS

Schmidt, E. et al., AlN-Buffered Superconducting NbN Nanowire Single-Photon Detector on GaAs, IEEE Transactions on Applied Superconductivity, vol. 27, No. 4, Jun. 2017, 5 pgs.
Shiino, Tatsuya et al., "Improvement of Critical Temperature of Superconducting NbTiN and NbN Thin Films Using the AlN Buffer Layer," Superconductor Science and Technology, Mar. 2010, 11 pgs.
Zhao, Qing-Yuan et al., "A compact superconducting nanowire memory element operated by nanowire cryotrons," Massachusetts Institute of Technology, Department of Electrical Engineering and Computer Science, Nov. 22, 2017, 20 pgs.
PsiQuantum Corp., International Search Report and Written Opinion, PCT/US2018/033042, dated Aug. 28, 2018, 13 pgs.
PsiQuantum Corp., International Search Report and Written Opinion, PCT/US2018/033041, dated Jul. 27, 2018, 16 pgs.
PsiQuantum Corp., International Search Report and Written Opinion, PCT/US2018/044091, dated Nov. 7, 2018, 13 pgs.
PsiQuantum Corp., Invitation to Pay Additional Fees/Partial Search Report, PCT/US2018/037892, dated Aug. 20, 2018, 12 pgs.
PsiQuantum Corp., Invitation to Pay Additional Fees/Partial Search Report, PCT/US2018/054414, dated Jan. 24, 2019, 21 pgs.
PsiQuantum Corp., International Search Report and Written Opinion, PCT/US2018/054414, dated Mar. 20, 2019, 21 pgs.
Najafi, Office Action dated Dec. 12, 2018, U.S. Appl. No. 16/028,288, 6 pgs.
Najafi, Notice of Allowance dated Apr. 5, 2019, U.S. Appl. No. 16/028,288, 10 pgs.
Najafi, Office Action dated Sep. 21, 2018, U.S. Appl. No. 16/028,293, 5 pgs.
Najafi, Final Office Action dated Mar. 1, 2019 U.S. Appl. No. 16/028,293, 5 pgs.
Najafi, Notice of Allowance dated Sep. 21, 2018, U.S. Appl. No. 16/012,520, 9 pgs.
Najafi, Office Action, U.S. Appl. No. 16/136,124, dated Apr. 4, 2019, 9 pgs.
Najafi, Quayle Office Action, U.S. Appl. No. 16/151,180, dated Jan. 31, 2019, 5pgs.
Najafi, Notice of Allowace, U.S. Appl. No. 16/151,180, dated Mar. 14, 2019, 5 pgs.
Najafi, Notice of Allowance U.S. Appl. No. 16/151,190, dated Feb. 6, 2019, 11 pgs.
Najafi, Notice of Allowance U.S. Appl. No. 16/151,190, dated Mar. 28, 2019, 5 pgs.
Najafi, Office Action, U.S. Appl. No. 16/046,815, dated Feb. 4, 2019, 9 pgs.
Najafi, Office Action, U.S. Appl. No. 16/046,807, dated Mar. 18, 2019, 10 pgs.
Najafi, Office Action, U.S. Appl. No. 16/107,143, dated Mar. 19, 2019, 11 pgs.
PsiQuantum Corp., International Search Report and Written Opinion, PCT/US2019/017687, dated Apr. 30, 2019, 8 pgs.
Stanfield, CMOS-Compatible, Piezo-Optomechanically Tunable Photonics for Visible Wavelengths and Cryogenic, Temperatures, vol. 27, Issue 20, pp. 28588-28605, 2019.
PsiQuantum Corp., International Search Report, PCT/US2019/017691, dated Apr. 23, 2019, 7 pgs.
PsiQuantum Corp., International Search Report and Written Opinion, PCT/US2019/030019, dated Jul. 17, 2019, 8 pgs.
PsiQuantum Corp., PCT/US2018/044091, International Preliminary Report on Patentability, dated Jan. 28, 2020, 6 pgs.
Najafi, Non-Final Office Action, U.S. Appl. No. 16/664,716, dated Apr. 1, 2020, 14 pgs.
PsiQuantum, International Search Report / Written, PCT/US2019/051853, dated Jan. 27, 2020, 13 pgs.
Mohsen K. Akhlaghi et al., Gated Mode Superconducting Nanowire Single Photon Detectors, vol. 20, No. 2, Jan. 16, 2012, ISSN 1094-4087, 9 pgs.
PsiQuantum, International Preliminary Report on Patentability, PCT/US12018/033041, dated Nov. 26, 2019, 8 pgs.
PsiQuantum, International Preliminary Report on Patentability, PCT/US2018/054414 , dated Apr. 8, 2020, 15 pgs.
PsiQuantum, International Search Report / Written, PCT/US2018/037892, dated Oct. 17, 2018, 18 pgs.
PsiQuantum, International Preliminary Report on Patentability, PCT/US2018/037892, dated Dec. 17, 2019, 12 pgs.
Najafi, Non-Final Office Action, U.S. Appl. No. 16/553,068, dated Apr. 1, 2020, 11 pgs.
Najafi, Non-Final Office Action, U.S. Appl. No. 16/544,718, dated Aug. 17, 2020, 6 pgs.
Najafi, Notice of Allowance, U.S. Appl. No. 16/553,068, dated Sep. 18, 2020, 8 pgs.
Najafi, Notice of Allowance, U.S. Appl. No. 16/473,550, dated Sep. 24, 2020, 8 pgs.
Najafi, Notice of Allowance, U.S. Appl. No. 16/473,550, dated Nov. 3, 2020, 2 pgs.
Najafi, Notice of Allowance, U.S. Appl. No. 16/553,068, dated Nov. 12, 2020, 2 pgs.
Najafi, Final Office Action, U.S. Appl. No. 16/664,716, dated Oct. 16, 2020, 14 pgs.

\* cited by examiner

SUPERCONDUCTING FIELD-PROGRAMMABLE GATE ARRAY

RELATED APPLICATIONS

This application claims priority to U.S. Provisional Patent Application No. 62/751,601, filed Oct. 27, 2018, entitled "Superconducting Field-Programmable Gate Array," which is hereby incorporated by reference in its entirety.

This application is related to U.S. patent application Ser. No. 16/107,143, filed Aug. 21, 2018, entitled "Superconductor-to-Insulator Devices," U.S. patent application Ser. No. 16/136,124, filed Sep. 19, 2018, entitled "Methods and Devices for Impedance Multiplication," and U.S. Provisional Application No. 62/660,192, filed Apr. 19, 2018, entitled "Superconducting Field-Programmable Gate Array," each of which is hereby incorporated by reference in its entirety.

TECHNICAL FIELD

The circuits and circuit components described in this document relate generally to reconfigurable superconducting components, including but not limited to, reconfigurable superconducting field-programmable gate arrays (FPGAs).

BACKGROUND

Analog circuits are used to implement various functions and perform operations on one or more inputs to produce an output. Thus, analog circuits are essential components in many electronic devices. Field-programmable gate arrays (FPGAs) are circuits designed to be configurable by a user after manufacturing. FPGAs generally include multiple circuit elements with reconfigurable interconnects that enable the elements to be wired in different configurations to perform more complex combinational functions.

Superconductors are materials capable of operating in a superconducting state with zero electrical resistance under particular conditions.

SUMMARY

There is a need for systems and/or devices with more efficient and effective methods for implementing programmable operations. Such systems, devices, and methods optionally complement or replace conventional systems, devices, and methods for implementing programmable operations.

Utilizing superconductor(s) to implement analog circuit(s) allows the circuit(s) to operate at cryogenic temperatures and at nanoscale sizes, or from a different perspective, implementing such circuits utilizing superconductors or one or more superconductor elements allows such circuits to benefit from the properties of superconductors. For example, such devices would be beneficial for low-latency operations directly on a cryogenic chip.

Accordingly, some embodiments include a device with multiple superconducting wires (e.g., superconducting thin-film nanowires) making a circuit, where each nanowire is thermally-coupled to a gate input. In some embodiments, the gate inputs are optionally configured to operate in a steady state, e.g., constantly maintaining the corresponding nanowire in a superconducting state or constantly maintaining the corresponding nanowire in a non-superconducting state. The steady state inputs enable different configurations of the superconducting nanowires, thereby adjusting capacitance, inductance, and resistance of the circuit.

In some embodiments, the gate inputs are heat sources that are thermally-coupled to, and electrically insulated from, the respective superconducting wires. In these embodiments, the heat sources are configured to selectively provide heat sufficient to selectively transition the corresponding superconducting wires from the superconducting state to the non-superconducting (e.g., conductive) state. In some embodiments, the gate inputs can include strain-inducing elements, such as piezoelectrics and the like, that are physically-coupled to the respective superconducting wires. In these embodiments, the strain-inducing elements can be configured to selectively provide a strain (stress) on the corresponding superconducting wires sufficient to selectively transition those wires from the superconducting state to an insulating state.

In one aspect, some embodiments include a programmable circuit having: (1) a superconducting component arranged in a multi-dimensional array of alternating narrow and wide portions, the superconducting component having an input terminal at a first end and an output terminal at a second end opposite of the first end; and (2) control circuitry coupled to the narrow portions of the superconducting component, the control circuitry configured to selectively transition the narrow portions between superconducting and non-superconducting states. In some embodiments, the superconducting component is a thin film of superconducting material. In some embodiments, the superconducting component consists essentially of a thin film of superconducting material. In some embodiments, the superconducting component is configured such that in response a gate input from the control circuitry the corresponding narrow portion transitions from a superconducting state to a non-superconducting state.

In another aspect, some embodiments include a programmable circuit, having: (1) a configurable superconducting component having an input terminal, an output terminal, and a plurality of gate terminals; and (2) control circuitry coupled to the superconducting component via the plurality of gate terminals, the control circuitry adapted to selectively adjust capacitance, inductance, and/or resistance of the superconducting component.

In another aspect, some embodiments include a method of operating a programmable circuit. The method includes: (1) providing a first current to a superconducting component arranged in a multi-dimensional array of alternating narrow and wide portions, the first current configured to maintain the superconducting component in a superconducting state; (2) configuring the superconducting component to perform a first operation by providing constant heat (or piezoelectric strain) to a first subset of the narrow portions, the constant heat configured to transition the first subset of narrow portions from the superconducting state to a non-superconducting state; (3) while the superconducting component is configured to perform the first operation: (a) receiving one or more inputs via a second subset of the narrow portions, distinct from the first subset; and (b) obtaining an electrical output via a subset of the wide portions, the electrical output corresponding to a result of the first operation on the one or more inputs.

Thus, superconducting devices and systems are provided with methods for programming and operating circuitry, thereby increasing the effectiveness, efficiency, and user satisfaction with such circuitry.

BRIEF DESCRIPTION OF THE DRAWINGS

For a better understanding of the various described embodiments, reference should be made to the Detailed Description below, in conjunction with the following drawings in which like reference numerals refer to corresponding parts throughout the figures.

DETAILED DESCRIPTION

Figure 1A:
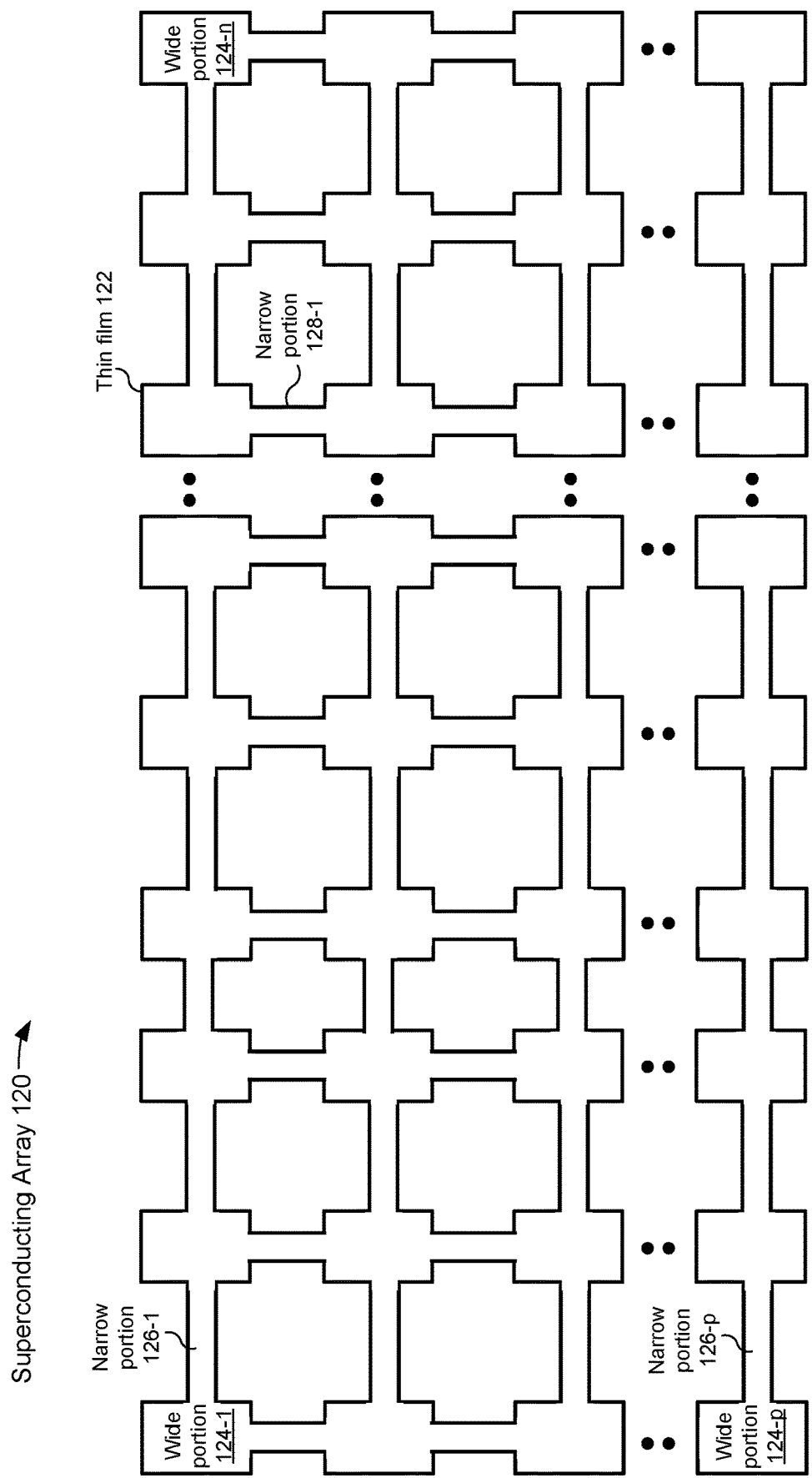
FIGS. 1A-1B are schematic diagrams illustrating representative superconducting arrays in accordance with some embodiments.

Reference will now be made in detail to embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

Many modifications and variations of this disclosure can be made without departing from its spirit and scope, as will be apparent to those skilled in the art. The specific embodiments described herein are offered by way of example only, and the disclosure is to be limited only by the terms of the appended claims, along with the full scope of equivalents to which such claims are entitled.

As used herein, a "superconducting circuit" or "superconductor circuit" is a circuit having one or more superconducting materials. For example, a superconducting logic circuit is a logic circuit that includes one or more superconducting materials. As used herein, a "superconducting" material is a material that is capable of operating in a superconducting state (under particular conditions). For example, a material that operates as a superconductor (e.g., operates with zero electrical resistance) when cooled below a particular temperature (e.g., a critical temperature) and having less than a maximum current flowing through it. The superconducting materials may also operate in an "off" state where little or no current is present. In some embodiments, the superconducting materials operate in a non-superconducting state during which the materials have a non-zero electrical resistance (e.g., a resistance in the range of one thousand to ten thousand ohms). For example, a superconducting material supplied with a current greater than a threshold superconducting current for the superconducting material may transition from a superconducting state with zero electrical resistance to a non-superconducting state with non-zero electrical resistance. As an example, superconducting thin film 122 is a superconducting material that is capable of operating in a superconducting state (e.g., under particular operating conditions).

As used herein, a "wire" is a section of material configured for transferring electrical current. In some embodiments, a wire includes a section of material conditionally capable of transferring electrical current (e.g., a wire made of a superconducting material that is capable of transferring electrical current while the wire is maintained at a temperature below a threshold temperature). A cross-section of a wire (e.g., a cross-section that is perpendicular to a length of the wire) optionally has a geometric (e.g., flat or round) shape or an irregular (also sometimes called a non-geometric) shape. In some embodiments, a length of a wire is greater than a width or a thickness of the wire (e.g., the length of a wire is at least 5, 6, 7, 8, 9, or 10 times greater than the width and the thickness of the wire).

Figure 1B:
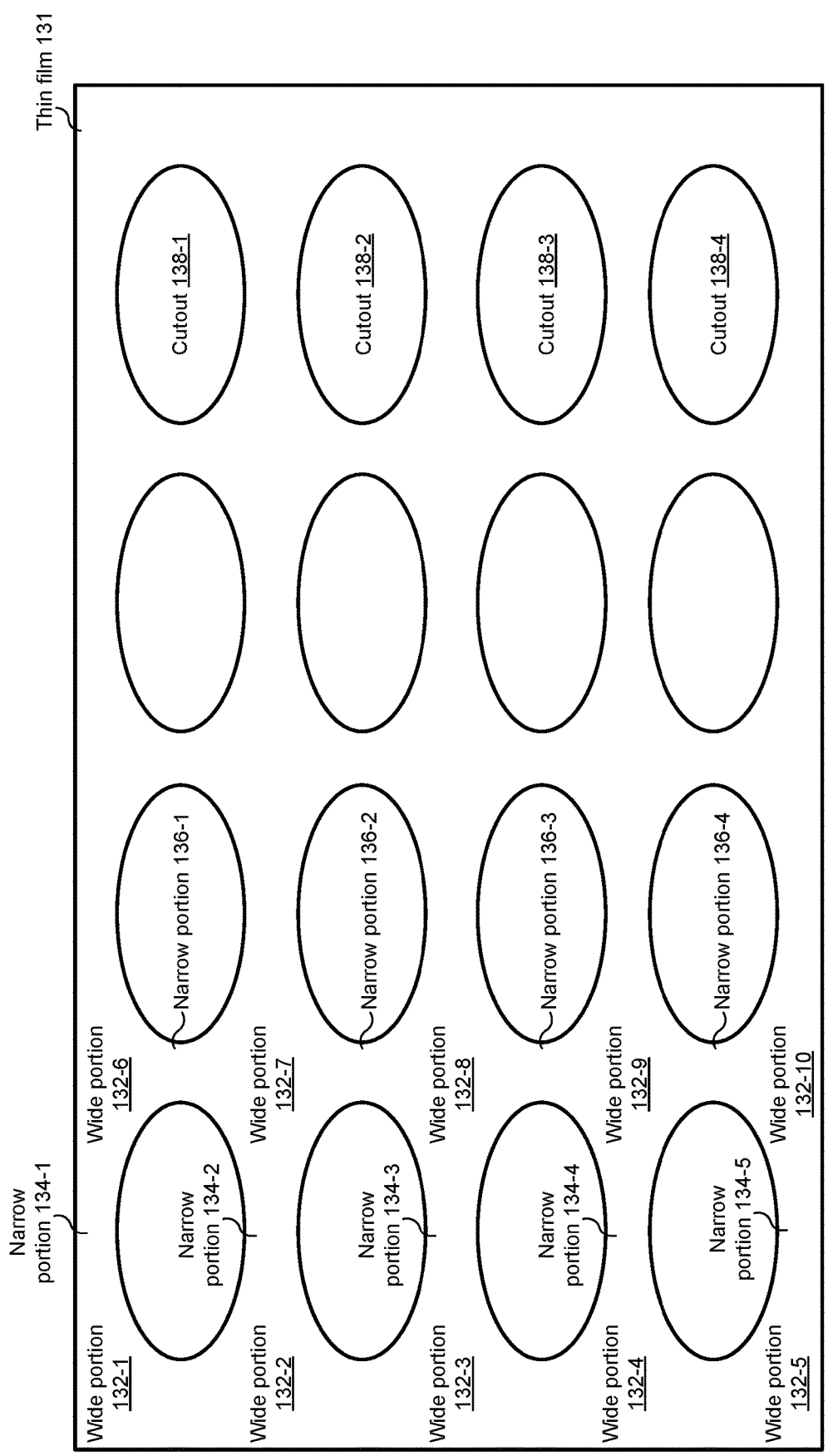

FIGS. 1A-1B are schematic diagrams illustrating representative superconducting arrays in accordance with some embodiments. FIG. 1A is a schematic diagram illustrating a superconducting array 120 in accordance with some embodiments. The superconducting array 120 includes alternating wide portions 124 and narrow portions 126, 128. In some embodiments, the narrow portions 126, 128 each have a width that is less than a width of a wide portion 124 (e.g., half or a quarter of the width of a wide portion 124). In some embodiments, each wide portion 124 has a same length and/or width as other wide portions 124. In some embodiments, each narrow portion 126, 128 has a same length and/or width as other narrow portions 126, 128. In some embodiments, a first subset of the narrow portion 126, 128 have a different length and/or width as a second subset of the narrow portions 126, 128. For example, in some embodiments, the narrow portions 128 have a different width than the narrow portions 126. In some embodiments, the narrow portions 126, 128 each have a width ranging from 50 nanometers (nm) to 5 microns (μm). In some embodiments, the narrow portions 126, 128 each have a length ranging from 200 nm to 2 microns μm. In some embodiments, the wide portions 124 each have a width ranging from 100 nm to 10 μm. In some embodiments, the wide portions 124 each have a length ranging from 100 nm to 10 microns μm. In accordance with some embodiments, the superconducting array 120 includes 'n' columns and 'p' rows, where 'n' and 'p' range from 1 to many (e.g., 10, 50, or 100). In some embodiments, each row of the superconducting array 120 has a same number of columns as other rows (e.g., the superconducting array 120 is rectangular in shape). In some embodiments, a first subset of the rows of the superconducting array 120 has a different number of columns as a second subset of the rows. In some embodiments, a first subset of the columns of the superconducting array 120 has a different number of rows as a second subset of the columns.

In some embodiments, the thin film 122 includes a thin film of one or more superconducting materials, such as niobium or niobium alloys. In accordance with some embodiments, each wide portion of the superconducting component 100 has a corresponding terminal. Alternatively, in some embodiments, less than all of wide portions of the superconducting component have corresponding terminals to which other circuitry or components can be electrically coupled.

Although some of the Figures show examples of superconductors having rectangular geometry, in some embodiments, the various superconductors described herein have other geometric (e.g., oval or circular) or non-geometric forms. FIG. 1B illustrates a superconducting array 130 in accordance with some embodiments. The superconducting array 130 is composed of a superconducting thin film 131 having alternating wide portions 132 and narrow portions 134, 136 defined by curved (oval) cutouts 138 in accordance with some embodiments. In some embodiments, the various circuits described herein utilize a thin film with curved edges, such as those of the thin film 131. Curved edges and rounded corners improve current flow in some circumstances by reducing current crowding at corners. Curved edges, such as those in FIG. 1B, also reduce capacitive coupling between wide portions 132 (e.g., reduce cross-talk) in some circumstances as compared to straight edges.

Figure 2:
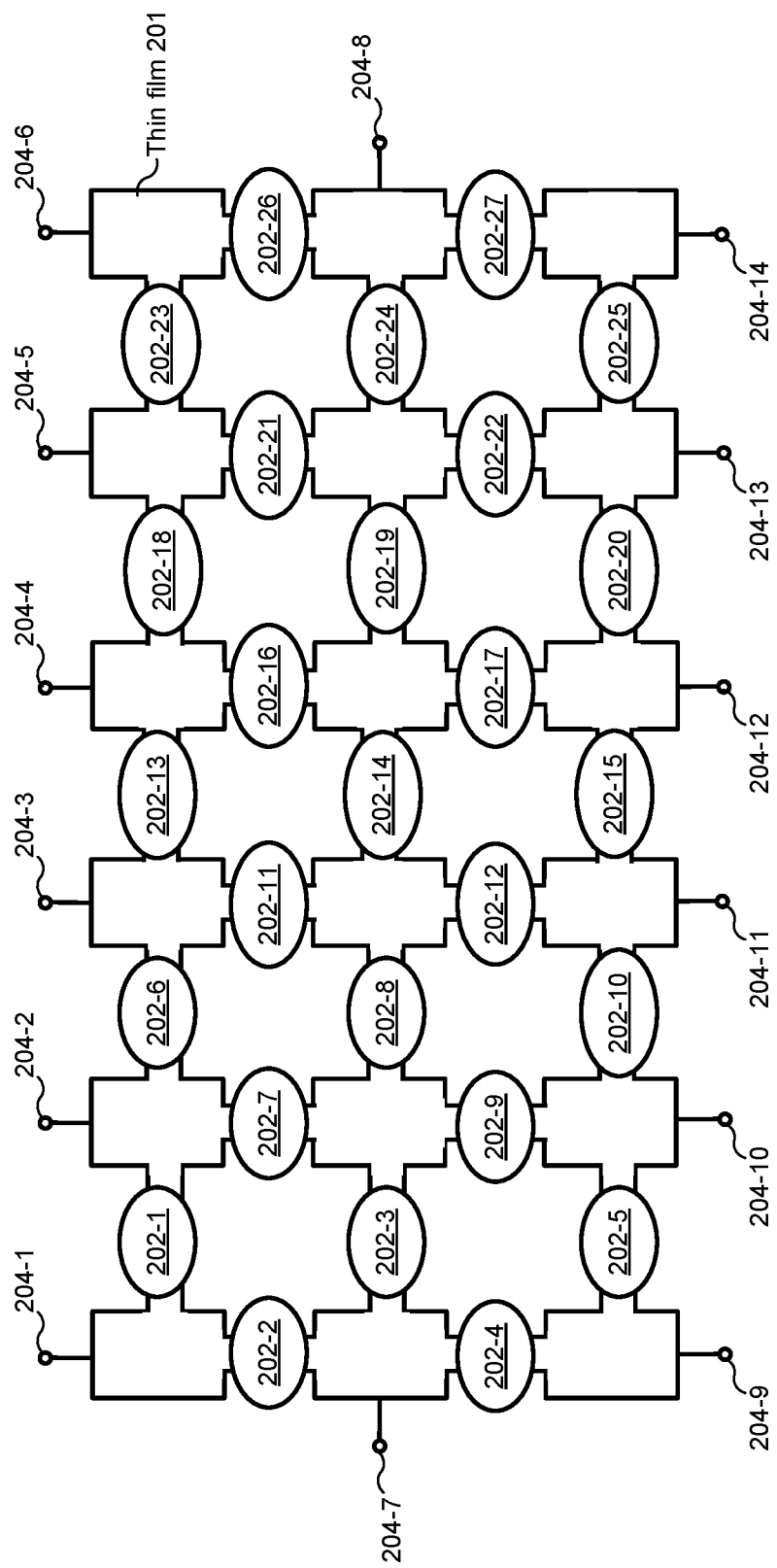
FIG. 2 is a schematic diagram illustrating a representative superconducting circuit in accordance with some embodiments.

FIG. 2 is a schematic diagram illustrating a superconducting circuit 200 in accordance with some embodiments. The superconducting circuit 200 includes a thin film 201 having alternating narrow and wide portions. The superconducting circuit 200 also includes a heat source 202 thermally coupled to each narrow portion (e.g., the heat source is on a layer above or below the layer of the thin film 201), or to a subset of the narrow portions. In some embodiments, one or more of the narrow portions is not thermally coupled to a heat source 202. For example, the superconducting circuit 200 is configured such that one or more of the narrow portions is to be maintained in a superconducting state, and accordingly a heat source 202 is not coupled to those portions. In some embodiments, a heat source 202 is thermally-coupled and electrically-isolated from a corresponding narrow portion, e.g., to prevent current flow and quantum tunneling. In some embodiments, the heat sources 202 include two or more types of heat sources, e.g., a first type of heat source comprising a photon detection circuit and a second type of heat source comprising a resistor.

In some embodiments, rather than a heat source 202, a piezoelectric source is coupled to each narrow portion, or a subset of the narrow portions. In some embodiments, each piezoelectric source is physically coupled to a corresponding narrow portion and configured to selectively apply a strain (stress) on the narrow portion. In some embodiments, the strain applied to the narrow portion is sufficient to transition the narrow portion from the superconducting state to an insulating (high resistance) state. Although the following figures are shown and described with heat sources, one of skill in the art, after reading the present disclosure would recognize that the individual heat sources could be replaced with piezoelectric sources.

The superconducting circuit 200 also includes a plurality of electrical terminals 204 on the plurality of wide portions, the terminals 204 configured to be coupled to a respective input and/or output component (e.g., a readout circuit, an electrical ground, or a current source). In some embodiments, one or more of the wide portions of thin film 201 is not connected to a respective terminal 204. In some embodiments, the terminals 204 are connected to the wide portions at positions other than those shown in FIG. 2. In some embodiments, the terminals 204 include two or more types of terminals, e.g., composed of different materials and/or having varying dimensions, resistances, and/or impedances. As discussed below, the superconducting circuit 200 is programmable by adjusting operation of the heat sources 202.

Figure 3:
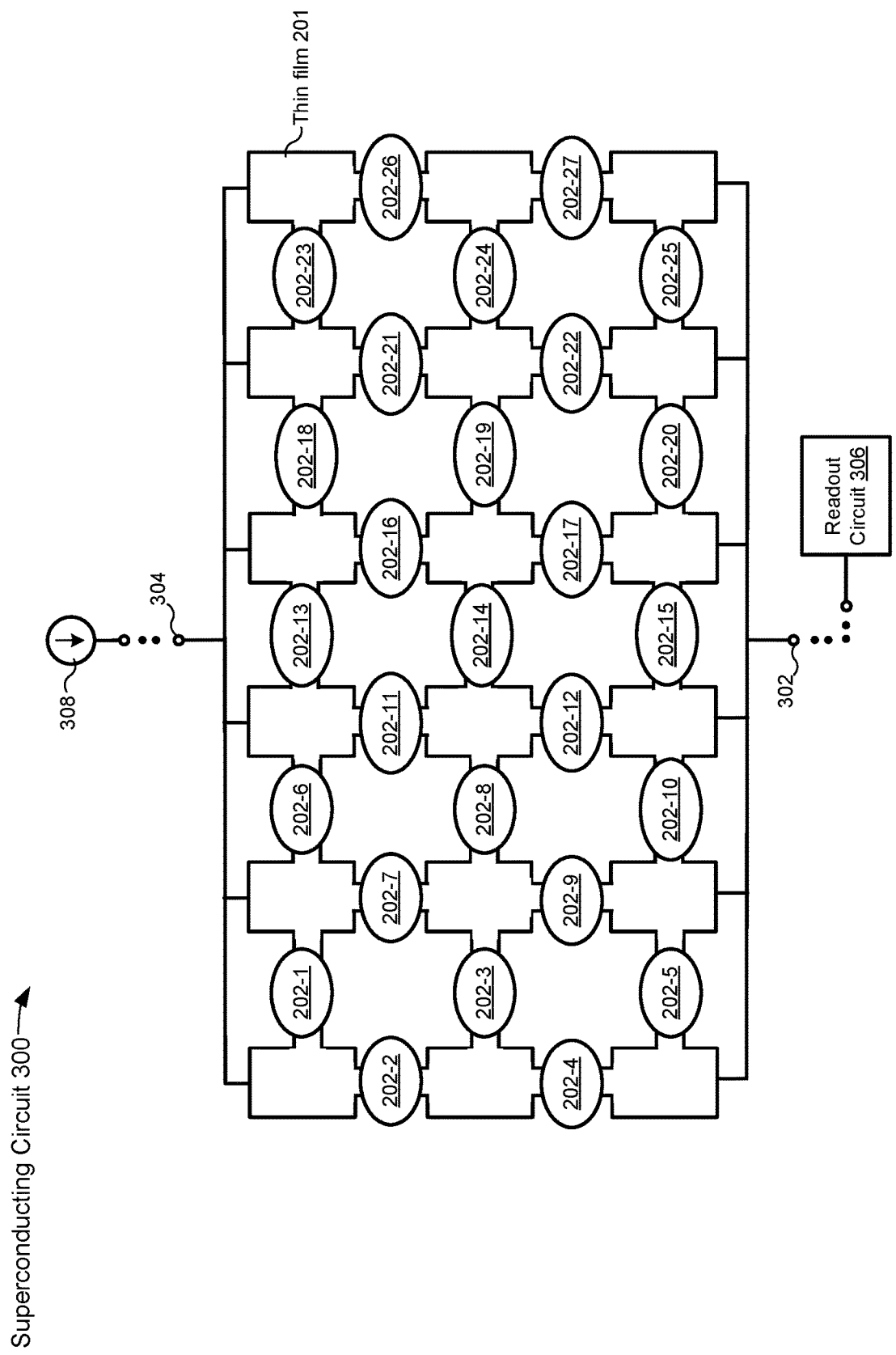
FIG. 3 is a schematic diagram illustrating another representative superconducting circuit in accordance with some embodiments.

FIG. 3 is a schematic diagram illustrating a superconducting circuit 300 in accordance with some embodiments. FIG. 3 shows the top terminals of the thin film 201 (e.g., terminals 204-1-204-6, FIG. 2) coupled to one another and having a shared terminal 304. The terminal 304 is coupled to a current source 308. In some embodiments, the current source 308 is configured to supply a bias current to the thin film 201 so that the thin film 201 operates in a superconducting state in the absence of other inputs (e.g., in the absence of heat from the heat sources 202). FIG. 3 further shows the bottom terminals of the thin film 201 (e.g., terminals 204-9-204-14, FIG. 2) coupled to one another and having a shared terminal 302. The terminal 302 is coupled to a readout circuit 306. In some embodiments, the readout circuit 306 is configured to determine, or react to, a current, resistance, inductance, or capacitance value of the thin film 201.

Figure 4A:
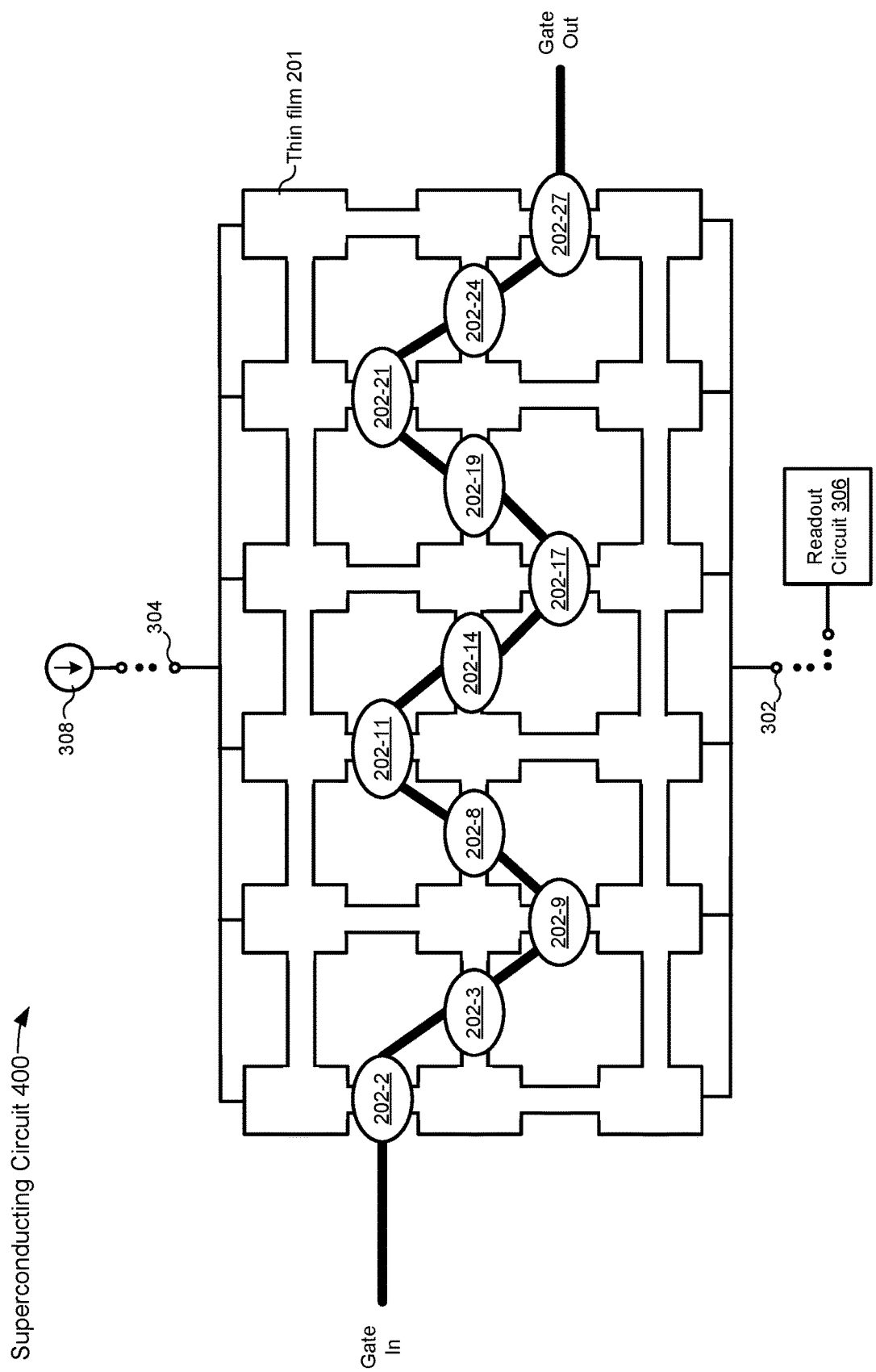
FIGS. 4A-4B are schematic diagrams illustrating a representative superconducting circuit in an example programmed state in accordance with some embodiments.
Figure 4B:
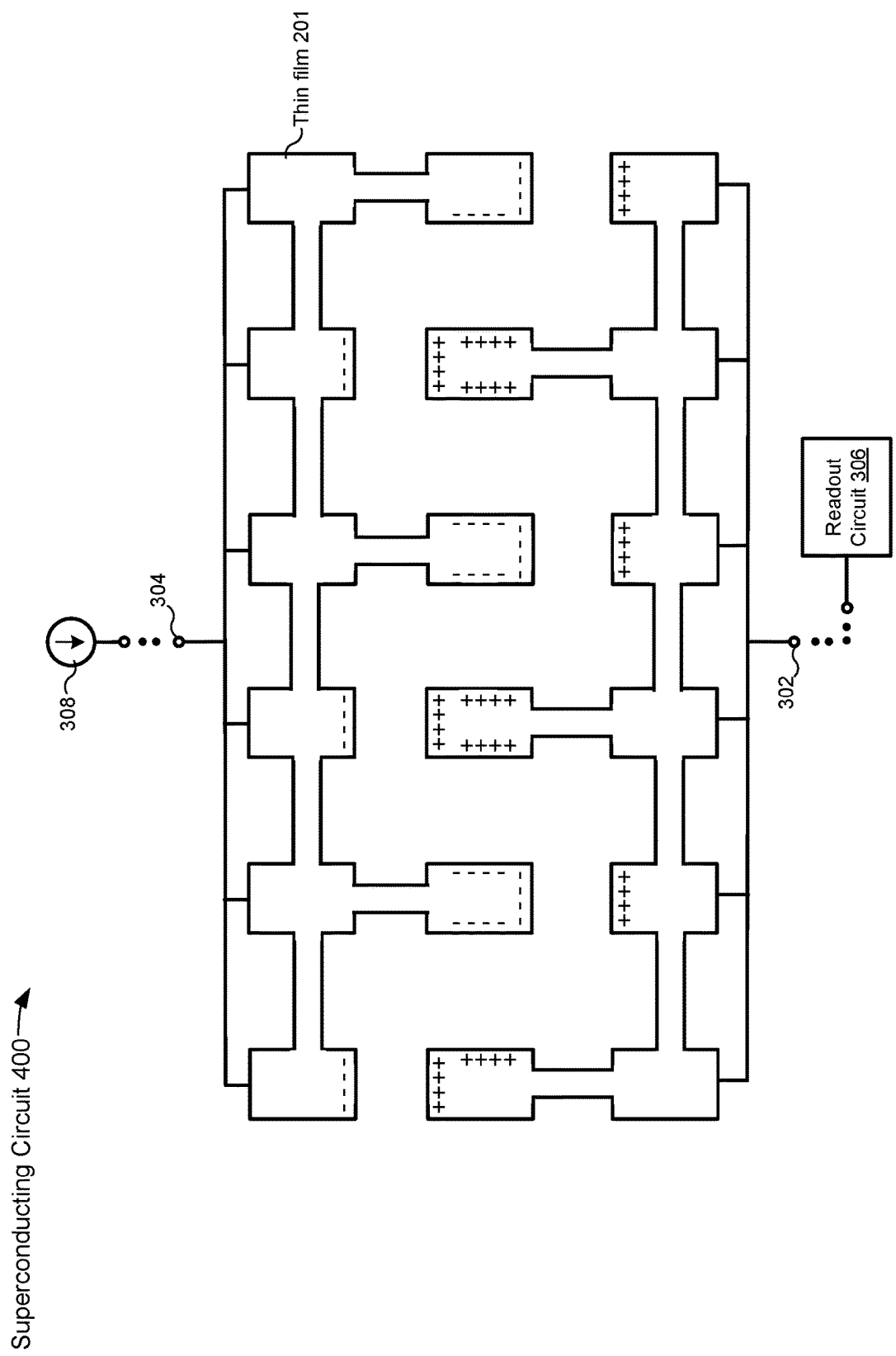

FIGS. 4A-4B are schematic diagrams illustrating a superconducting circuit 400 in an example programmed state (e.g., a selective capacitor) in accordance with some embodiments. The superconducting circuit 400 in FIG. 4A includes the superconducting circuit 300 of FIG. 3 and a gate line coupled to heat sources 202-2, 202-3, 202-9, 202-8, 202-11, 202-14, 202-17, 202-19, 202-21, 202-24, and 202-27. In some embodiments, the gate line is a conductive path or wire, e.g., on a same layer as the heat sources, or electrically coupled to the heat sources through a contact or via. In some embodiments, the gate line is composed of superconducting materials. In some embodiments, the gate line is a made of metal or a semiconductor. In some embodiments, the gate line operates in a superconducting state, while in other embodiments, the gate line operates in a non-superconducting, conductive state. In accordance with some embodiments, activation of the gate line causes the heat sources to generate heat sufficient to transition the corresponding narrow portions of the thin film 201 from the superconducting state to a non-superconducting (e.g., conductive) state. In some embodiments, the heat sources 202 shown in FIG. 3 and not shown in FIG. 4A are disabled in the example programmed state, e.g., the omitted heat sources are electrically-grounded or disconnected from any source so as not to provide any heat to the corresponding narrow portions.

Although FIG. 4A shows the heat sources coupled together via the gate line, in some embodiments, the heat sources are independently controlled and/or operated. In some embodiments, the heat sources 202-2, 202-3, 202-9, 202-8, 202-11, 202-14, 202-17, 202-19, 202-21, 202-24, and 202-27 are individually programmed to operate concurrently (e.g., in unison).

FIG. 4B shows the thin film 201 with the narrow portions in the non-superconducting state removed. As shown in FIG. 4B, activation of the gate line creates an open circuit with charge build-up between the current source 308 and the readout circuit 306. Thus, in the configuration shown in FIGS. 4A-4B the superconducting circuit 400 selectively operates as a capacitor (e.g., with a capacitance in the femtofarad (fF) to picofarad (pF) range).

Figure 5A:
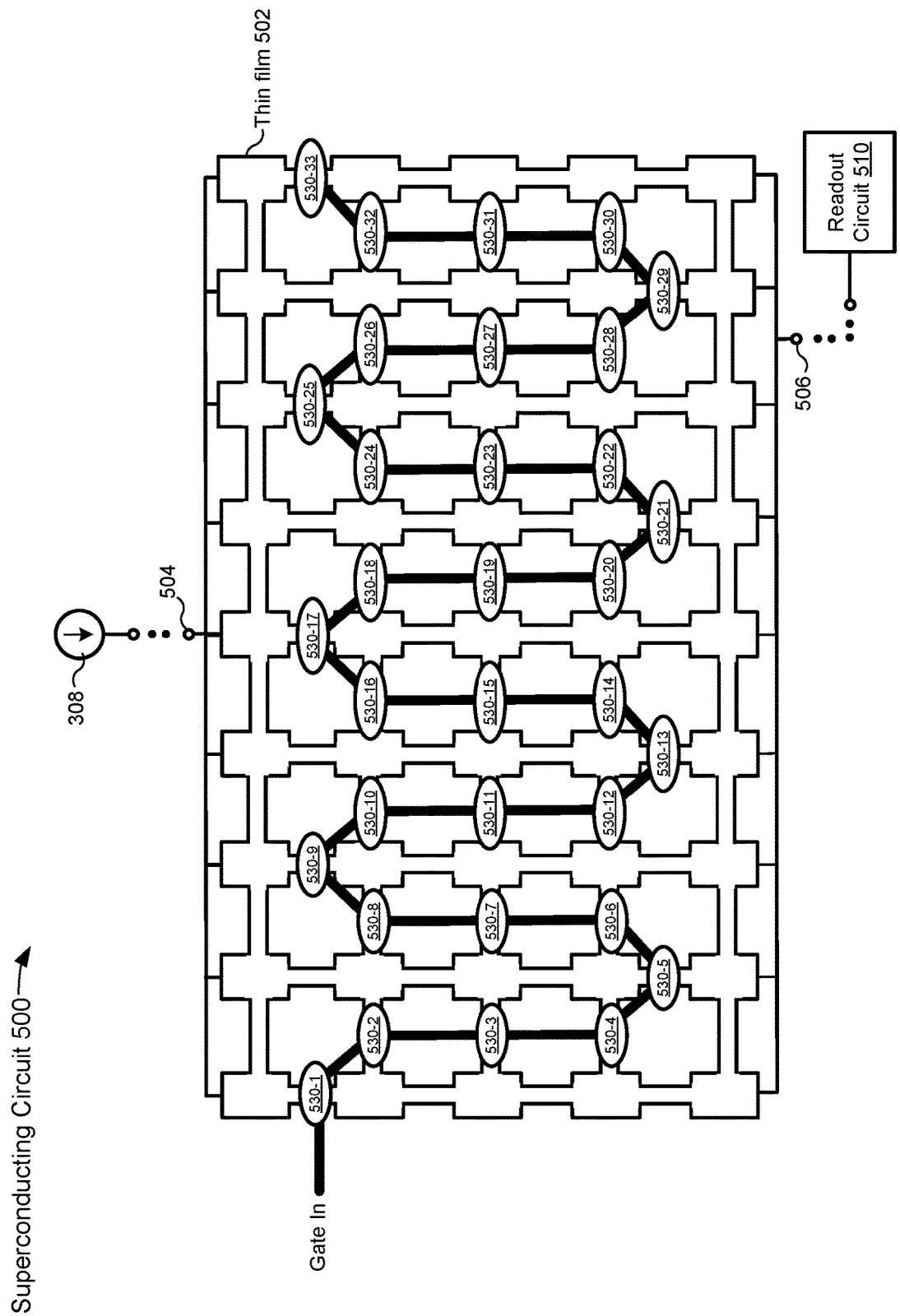
FIGS. 5A-5B are schematic diagrams illustrating a representative superconducting circuit in another example programmed state in accordance with some embodiments.
Figure 5B:
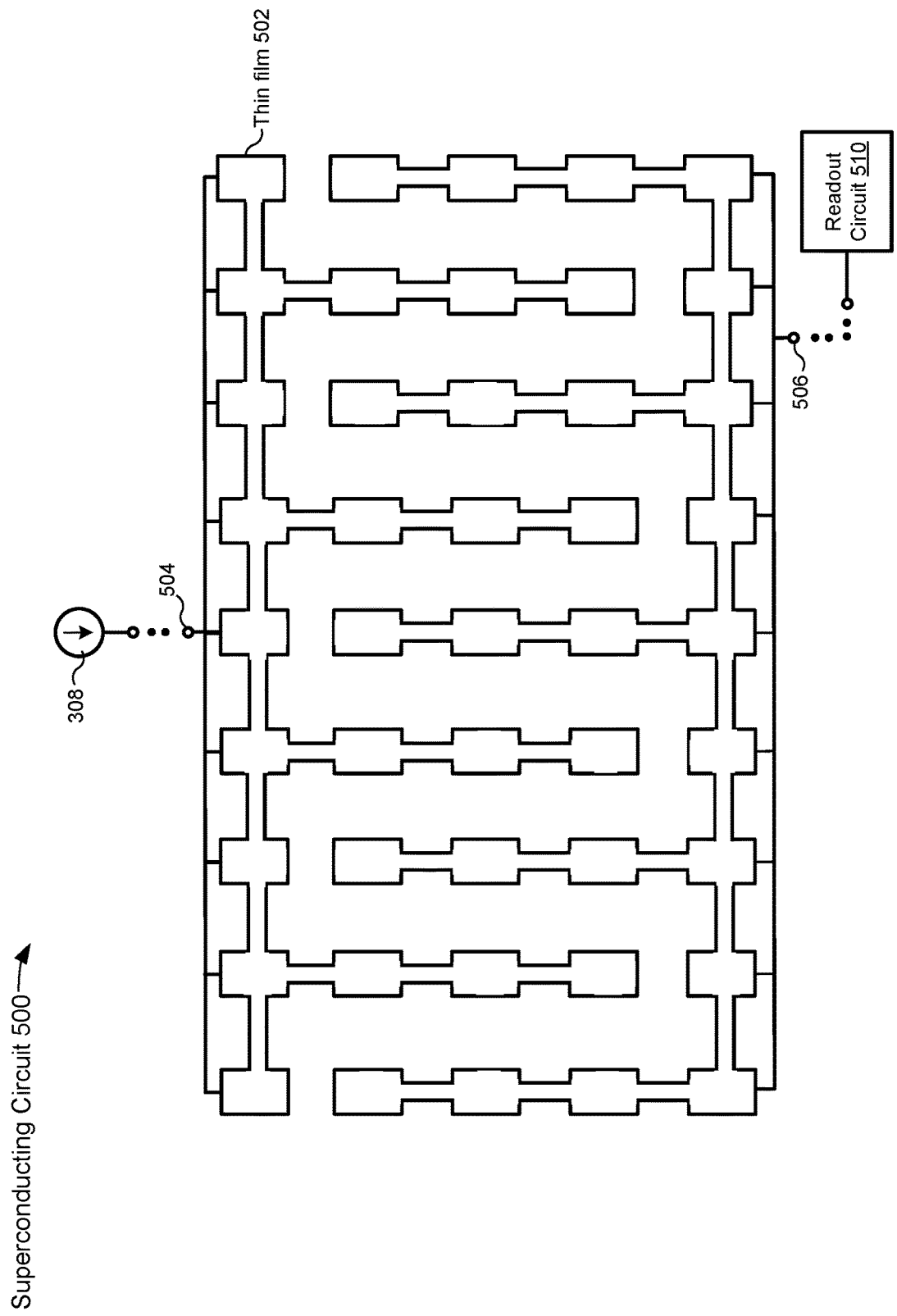

FIGS. 5A-5B are schematic diagrams illustrating a superconducting circuit 500 in another example programmed state (e.g., a selective capacitor) in accordance with some embodiments. The superconducting circuit 500 in FIG. 5A is similar to the superconducting circuit 400 in FIG. 4A, except that the gate line is coupled to a greater number of heat sources (e.g., heat sources 530-1 through 503-33 arranged in an oscillating comb-tooth pattern) than the superconducting circuit 400 in FIG. 4B. Similar to FIG. 4A, terminal 504 is coupled to a current source 308 and terminal 502 is coupled to readout circuit 510. The greater number of heat sources in use in FIGS. 5A-5B result in greater capacitance than the circuit in FIGS. 4A-4B. In accordance with some embodiments, activation of the gate line causes the heat sources to generate heat sufficient to transition the corresponding narrow portions of the thin film 502 from the superconducting state to a non-superconducting (e.g., conductive) state. FIG. 5B shows the thin film 502 with the narrow portions in the non-superconducting state removed. Activation of the gate line creates an open circuit with charge build-up between the current source 308 and the readout circuit 510. Thus, in the configuration shown in FIGS. 5A-5B the superconducting circuit 500 selectively operates as a capacitor, with a different capacitance than the configuration shown in FIGS. 4A-4B. Therefore, adjusting the number and arrangement of heat sources that are coupled to the gate line allows for adjustment of the resulting capacitance of the circuit.

Although FIG. 5A shows the heat sources coupled together via the gate line, in some embodiments, the heat sources are independently controlled and/or operated. In some embodiments, the heat sources are individually programmed to operate concurrently (e.g., using control circuitry coupled to the heat sources).

Figure 6A:
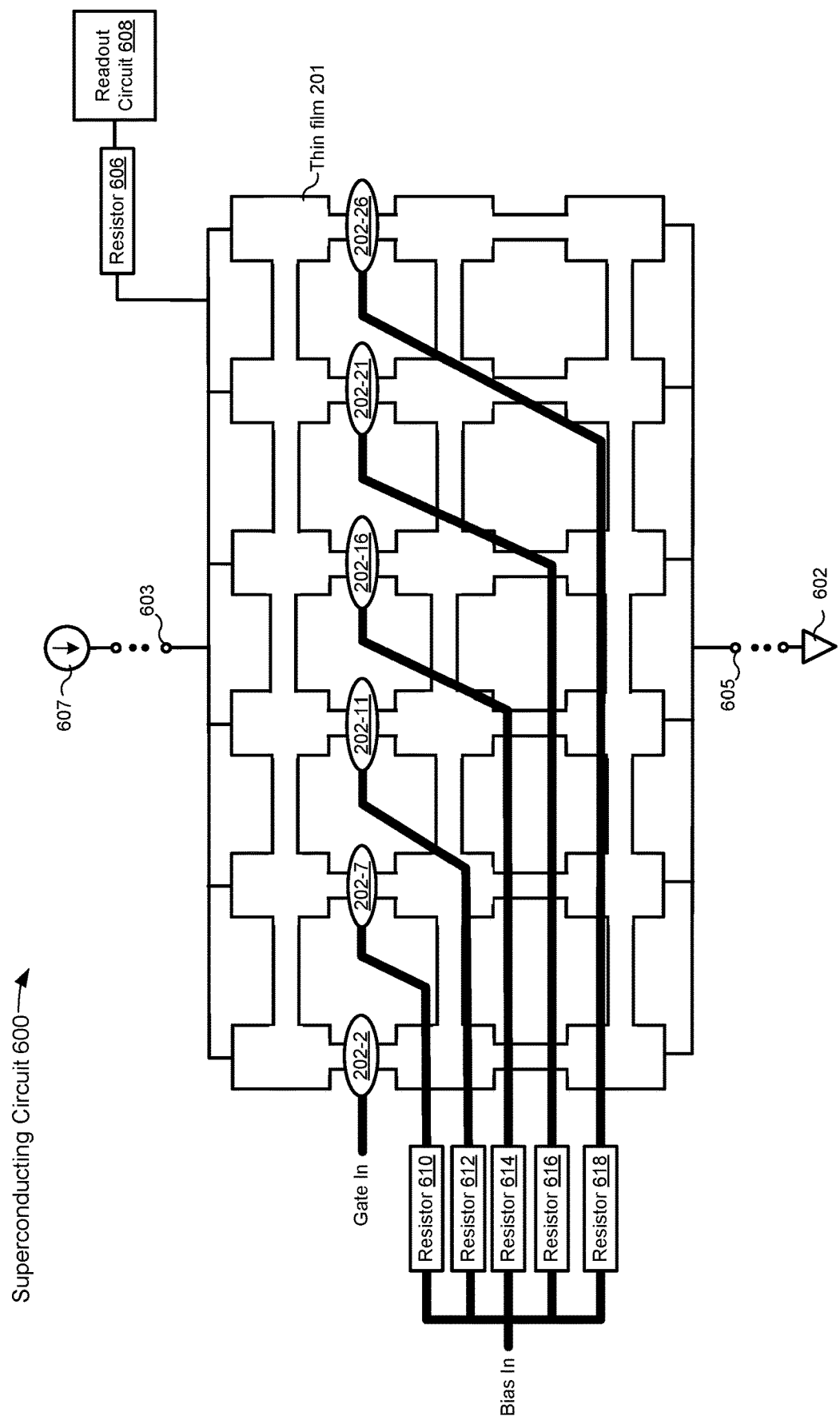
FIG. 6A is a schematic diagram illustrating a representative superconducting circuit in another example programmed state in accordance with some embodiments.

FIG. 6A is a schematic diagram illustrating a superconducting circuit 600 in another example programmed state (e.g., a current amplifier) in accordance with some embodiments. FIG. 6A shows the superconducting circuit 600 including the superconducting circuit 200 (FIG. 2) with the top terminals of the thin film 201 (e.g., terminals 204-1-204-6, FIG. 2) coupled to one another and having a shared terminal 603. The terminal 603 is coupled to a current source 607. The top terminals of the thin film 201 are further coupled to a readout circuit 608 via a resistor 606. In some embodiments, the current source 607 is configured to supply a bias current to the thin film 201 so that the thin film 201 operates in a superconducting state in the absence of other inputs (e.g., in the absence of heat from the heat sources 202). FIG. 6A further shows the bottom terminals of the thin film 201 (e.g., terminals 204-9-204-14, FIG. 2) coupled to one another and having a shared terminal 605. The terminal 605 is coupled to a reference node 602 (e.g., an electrical ground).

FIG. 6A further shows a gate line coupled to the heat source 202-2 in a first column of the thin film 201, and a bias line coupled to the heat sources 202-7, 202-11, 202-16, 202-21, and 202-26 in the remaining columns of the thin film 201. The bias line includes resistors (e.g., resistors 610, 612, 614, 616, and 618) coupled to the respective heat sources. In accordance with some embodiments, the resistor 612 has a higher resistance value than the resistor 610, the resistor 614 has a higher resistance value than the resistor 612, the resistor 616 has a higher resistance value than the resistor 614, and the resistor 618 has a higher resistance value than the resistor 618. In accordance with some embodiments, the bias line is coupled to a bias source and the bias source is configured to provide a current to the heat sources 202. The current from the bias source is split between the heat sources in accordance with the resistances of the resistors 610-618. In accordance with some embodiments, each heat source 202 generates heat proportional to the amount of current received by the heat source. Accordingly, biased as shown, heat sources 202-7, 202-11, 202-16, 202-21, and 202-26 provide heat to their respective narrow portions with the heat applied to each narrow portion decreasing from left to right. In accordance with some embodiments, the generated heat at each narrow portion is insufficient to transition that respective narrow portions from the superconducting state to a non-superconducting state, but the heat applied does result in the narrow portion corresponding to heater 202-7 being biased closer to its threshold current than the narrow portion corresponding to heater 202-26. That is, the generated heat adjusts the corresponding narrow portions to be closer to, but not exceeding, each narrow portion's superconducting current threshold with the difference between the narrow portions bias current and threshold current increasing from left to right in the figure. As described in further detail below, such a sequential biasing provides for the individual columns of the array to switch to a normal state in a sequential fashion (i.e., the system can operate as a cascading superconducting nanowire amplifier) when a gate current is applied to the gate heater 202-6. Advantageously, such an arrangement does not require different columns inductances to trigger the cascade and is therefore faster and possesses a higher dynamic range than embodiments that employ columns having different inductors (e.g., by requiring that the columns to have sequentially increasing lengths). While FIGS. 6A-6F show a gate array having 5 columns and two rows of heaters/narrow portions any number of columns can be used in combination with one or more narrow portions without departing from the scope of the present disclosure.

Although FIG. 6A shows the heat sources coupled together via the bias line, in some embodiments, the heat sources are independently controlled and/or operated. In some embodiments, the heat sources 202-7, 202-11, 202-16, 202-21, and 202-26 are individually programmed to operate concurrently. For example, each heat source is coupled to a distinct current source configured to supply a same current as results from the current divider shown in FIG. 6A.

Figure 6B:
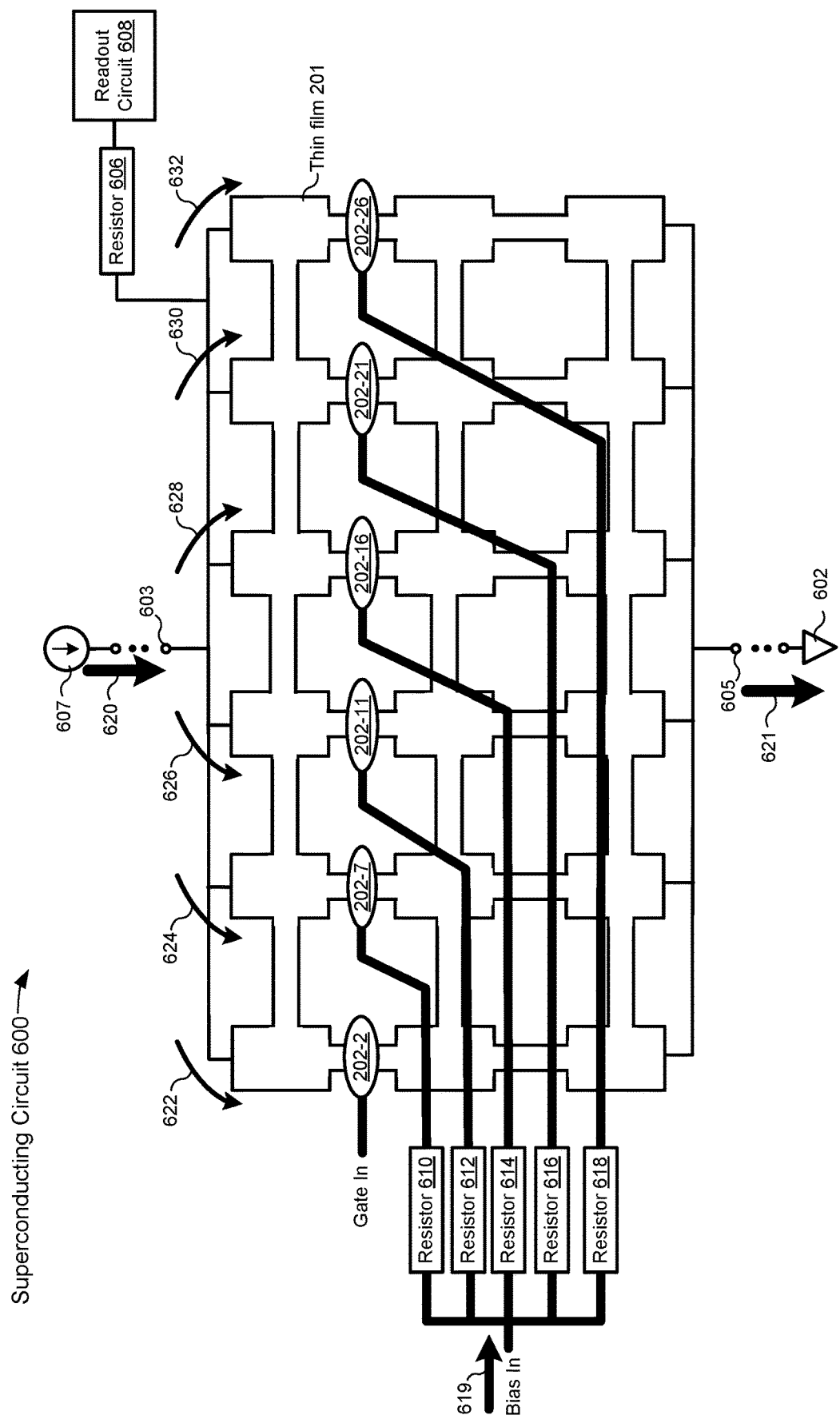
FIGS. 6B-6F are prophetic diagrams illustrating a representative operating sequence of the superconducting circuit of FIG. 6A in accordance with some embodiments.

FIGS. 6B-6F are prophetic diagrams illustrating a representative operating sequence of the superconducting circuit 600 of FIG. 6A in accordance with some embodiments. FIG. 6B shows a bias current 619 received at the bias line and distributed to the heat sources 202-7, 202-11, 202-16, 202-21, and 202-26. FIG. 6B also shows a current 620 from the bias current source 607. The current 620 distributes through the thin film 201 with a portion flowing through each column of the thin film, e.g., current portion 622 flowing through the first column, current portion 624 flowing through the second column, current portion 626 flowing through the third column, current portion 628 flowing through the fourth column, current portion 630 flowing through the fifth column, and current portion 632 flowing through the sixth column. FIG. 6B further shows the current 621 flowing from the thin film 201 to the reference node 602. In accordance with some embodiments, the current 621 is equal to the current 620 because the thin film 201 has zero electrical resistance and thus no current flows through the resistor 606 to the readout circuit 608.

Figure 6C:
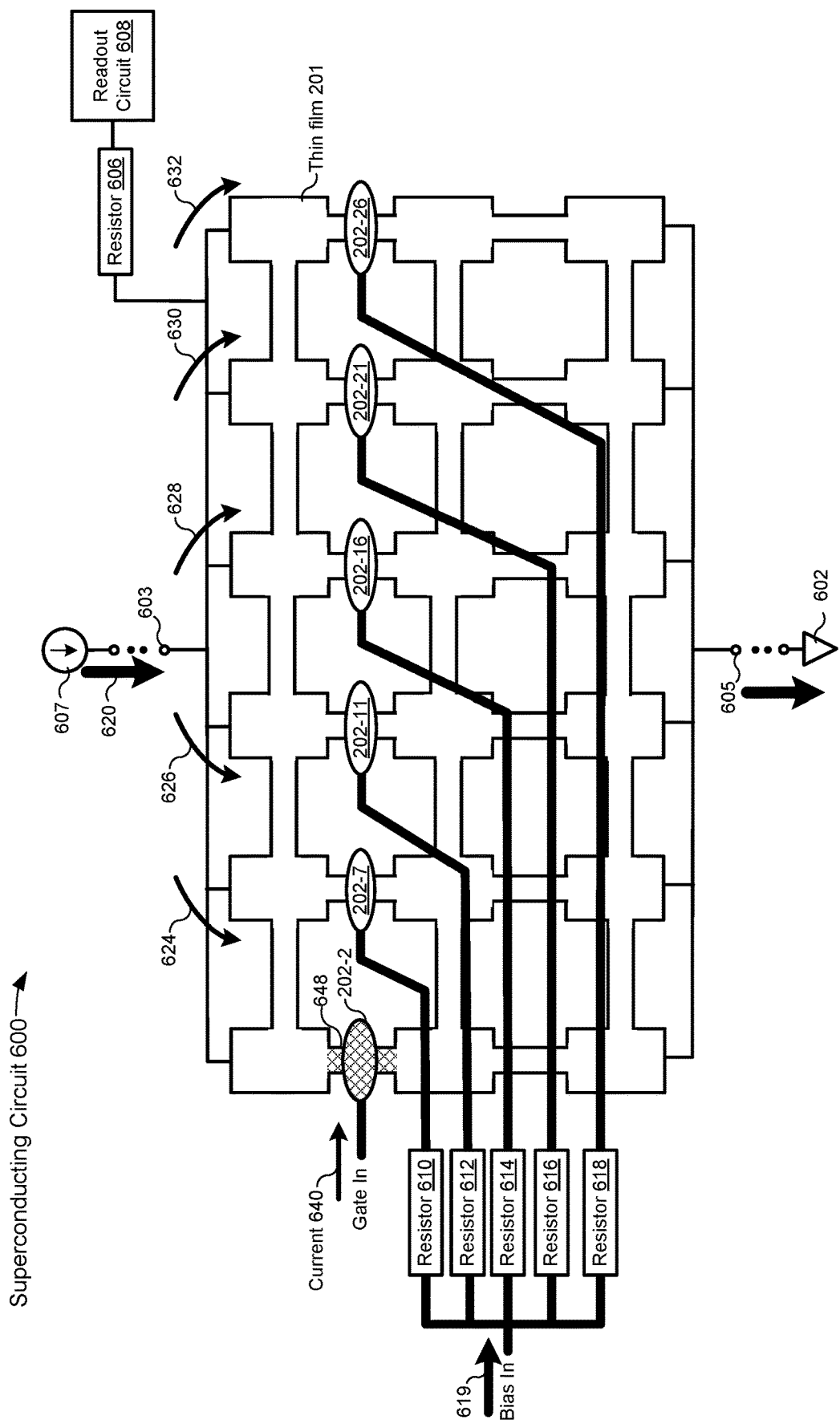
Figure 6D:
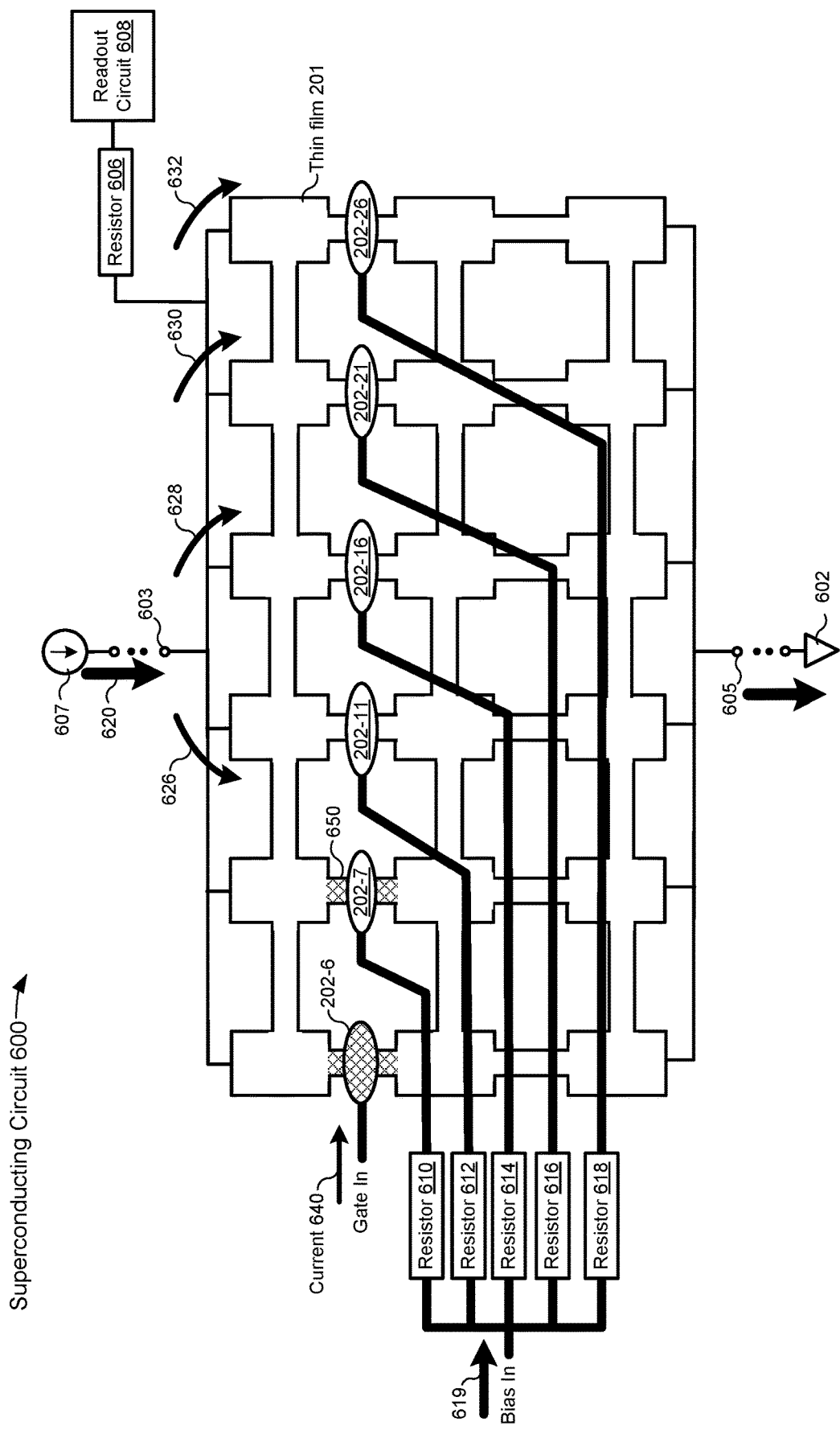

FIG. 6C shows an input current 640 received at the gate line at a first time. The current 640 causes the heat source 202-2 to generate heat and the generated heat causes the corresponding narrow portion 648 to transition from the superconducting state to a non-superconducting state. Once the narrow portion 648 transitions to the non-superconducting state, the current previously flowing through the narrow portion 648 redirects to the other columns of the thin film 201. FIG. 6D shows the narrow portion 650 corresponding to heat source 202-7 transitioning to the non-superconducting state at a second time, in response to receiving the redirected current. In accordance with some embodiments, the heat generated by the heat source 202-7 lowers the superconducting current threshold for the narrow portion 650 and the redirected current exceeds the lowered superconducting current threshold of the narrow portion 650. Therefore, the narrow portion 650 transitions from the superconducting state to the non-superconducting state. Once the narrow portion 650 transitions to the non-superconducting state, the current previously flowing through the narrow portion 650 redirects to the other columns of the thin film 201 that are still in the superconducting state.

Figure 6E:
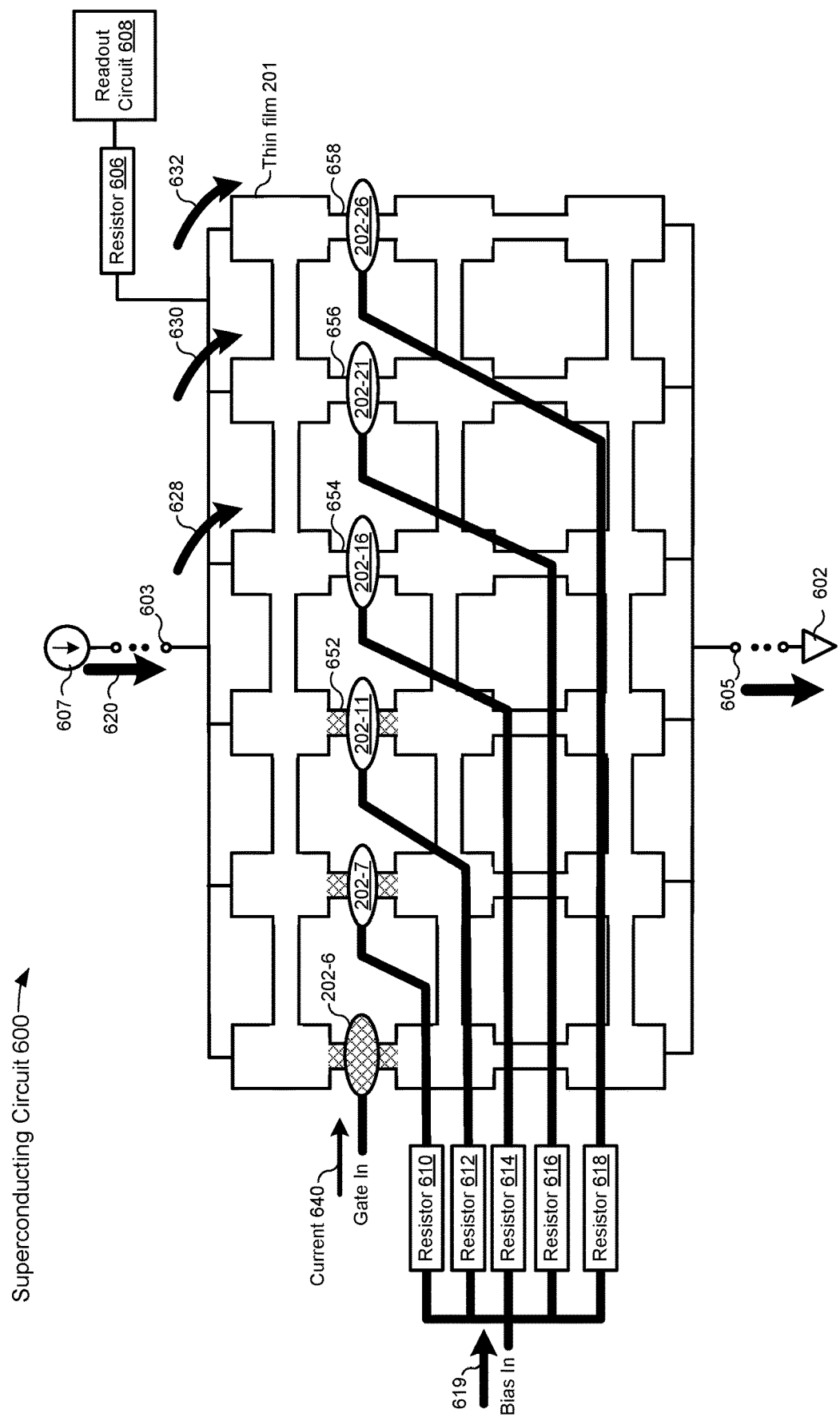

FIG. 6E shows the narrow portion 652 corresponding to heat source 202-11 transitioning to the non-superconducting state at a third time, in response to receiving the redirected current. In accordance with some embodiments, the heat generated by the heat source 202-11 lowers the superconducting current threshold for the narrow portion 652 (though not as much as the heat from heat source 202-7 lowers the threshold for the narrow portion 650) and the redirected current exceeds the lowered superconducting current threshold of the narrow portion 652. Therefore, the narrow portion 652 transitions from the superconducting state to the non-superconducting state. Once the narrow portion 652 transitions to the non-superconducting state, the current previously flowing through the narrow portion 652 redirects to the other columns of the thin film 201 that are still in the superconducting state. In a similar manner, the narrow portions 654, 656, and 658 sequentially transition from the superconducting state to a non-superconducting.

Figure 6F:
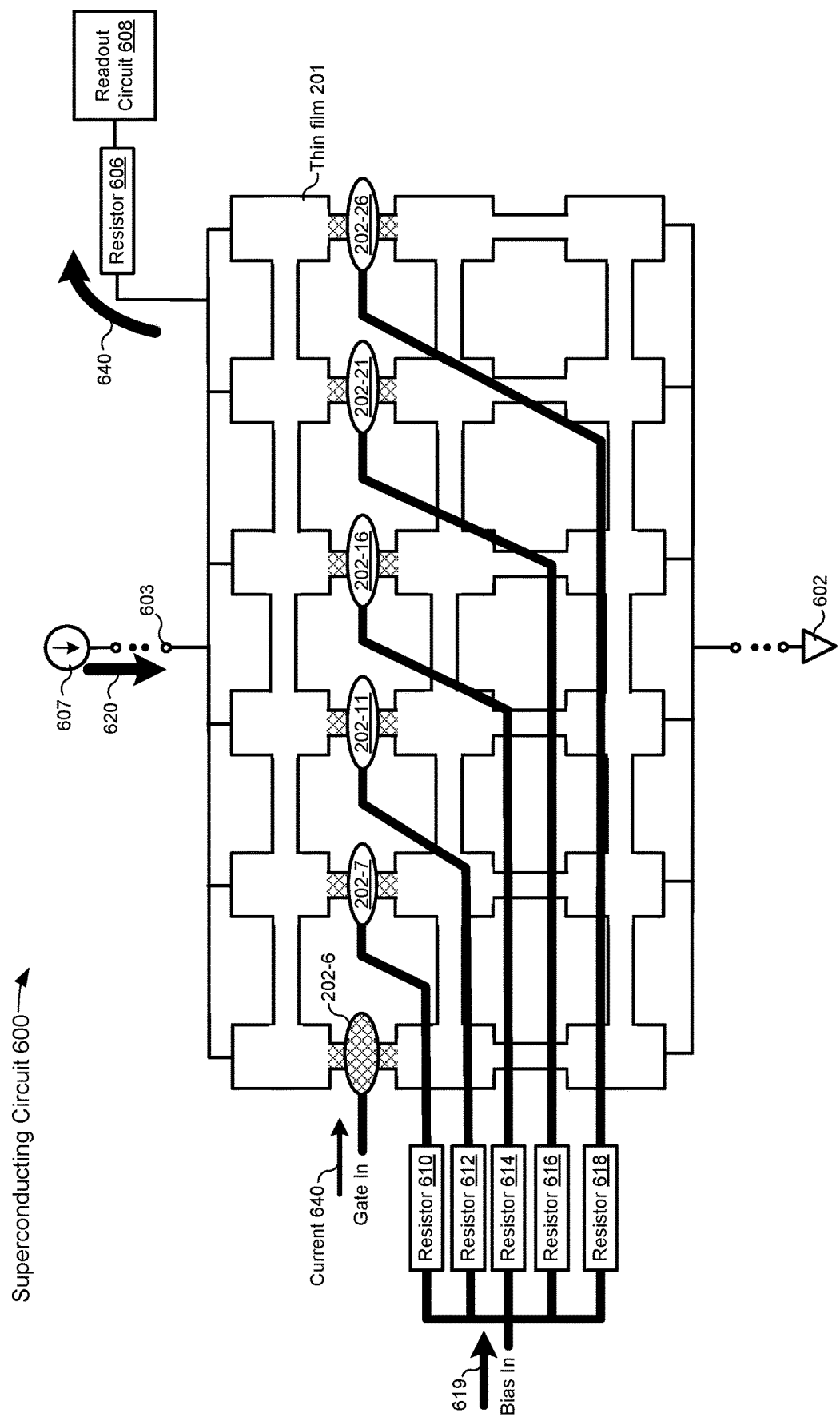

FIG. 6F shows each narrow portion 648-658 in the non-superconducting state and current from the current source 607 redirected to the readout circuit 608 via the resistor 606. In some embodiments, the resistor 606 is configured to have a resistance value significantly less than respective resistances of the narrow portions while the narrow portions are in the non-superconducting state (e.g., 1/10, 1/100, or 1/1000 the resistance of the individual narrow portions). Thus, FIGS. 6B-6F show a sequential transition of the narrow portions of the thin film 201 in response to a current received at the gate line. FIGS. 6B-6F further show current from the bias current source 607 provided to the readout circuit 608 (via the resistor 606) after transition of the narrow portions. In accordance with some embodiments, the current 620 from the current source 607 is significantly larger than the current 640 supplied to the gate line (e.g., 10 times or 100 times as much current). In this way, a relatively small input gate current results in a relatively larger current being supplied to the readout circuit 608.

Figure 7:
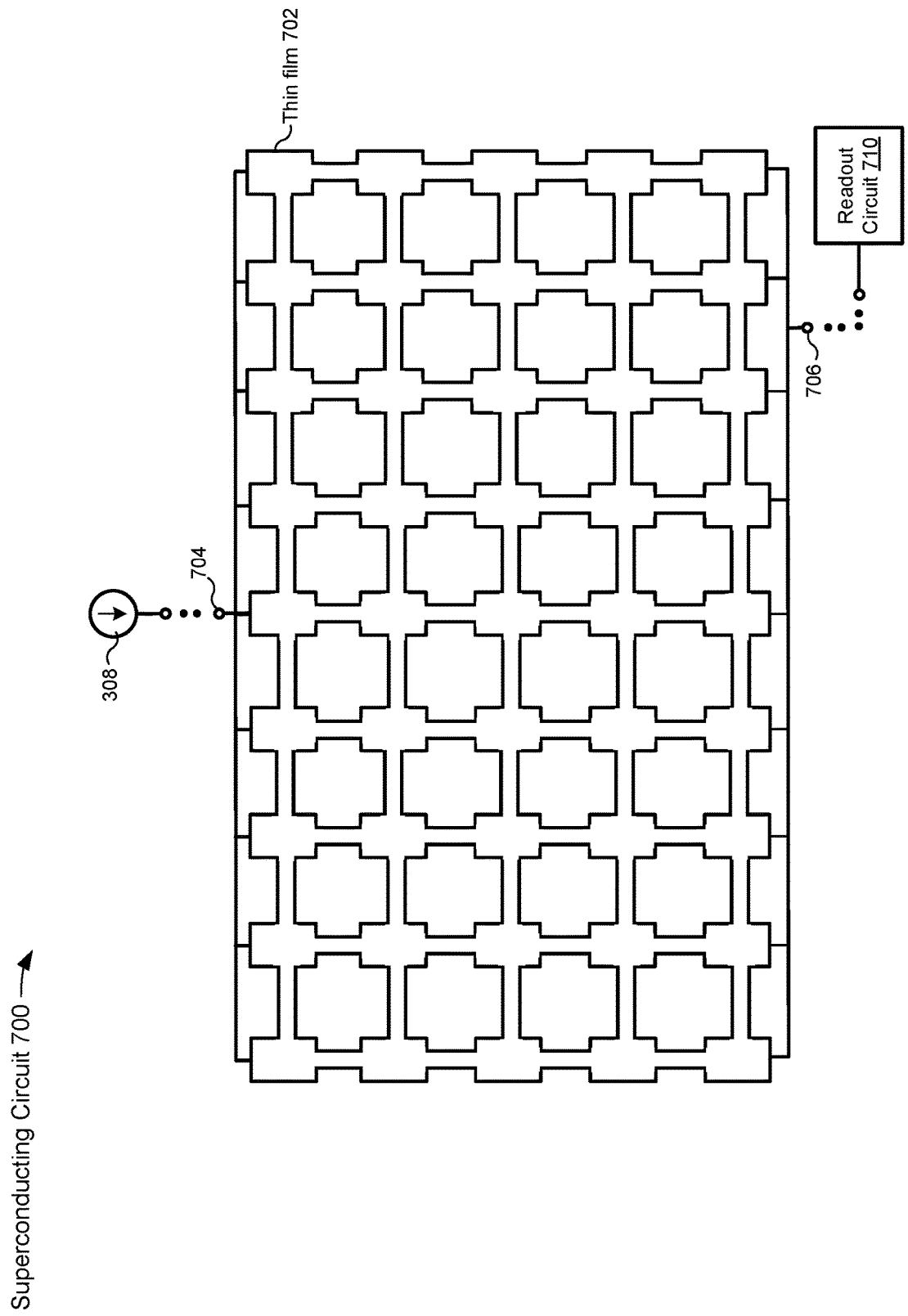
FIG. 7 is a schematic diagram illustrating a representative superconducting circuit in accordance with some embodiments.

FIG. 7 is a schematic diagram illustrating a superconducting circuit 700 in accordance with some embodiments. The superconducting circuit 700 is similar to the superconducting circuit 300 in FIG. 3, except that the thin film 702 in FIG. 7 has more rows and columns than the thin film 201 in FIG. 3. Similar to FIG. 3, terminal 704 is coupled to a current source 308 and terminal 706 is coupled to readout circuit 710. Although not shown in FIG. 7, each narrow portion of the thin film 702 is coupled to a source (e.g., a heat source or piezoelectric source).

Figure 8A:
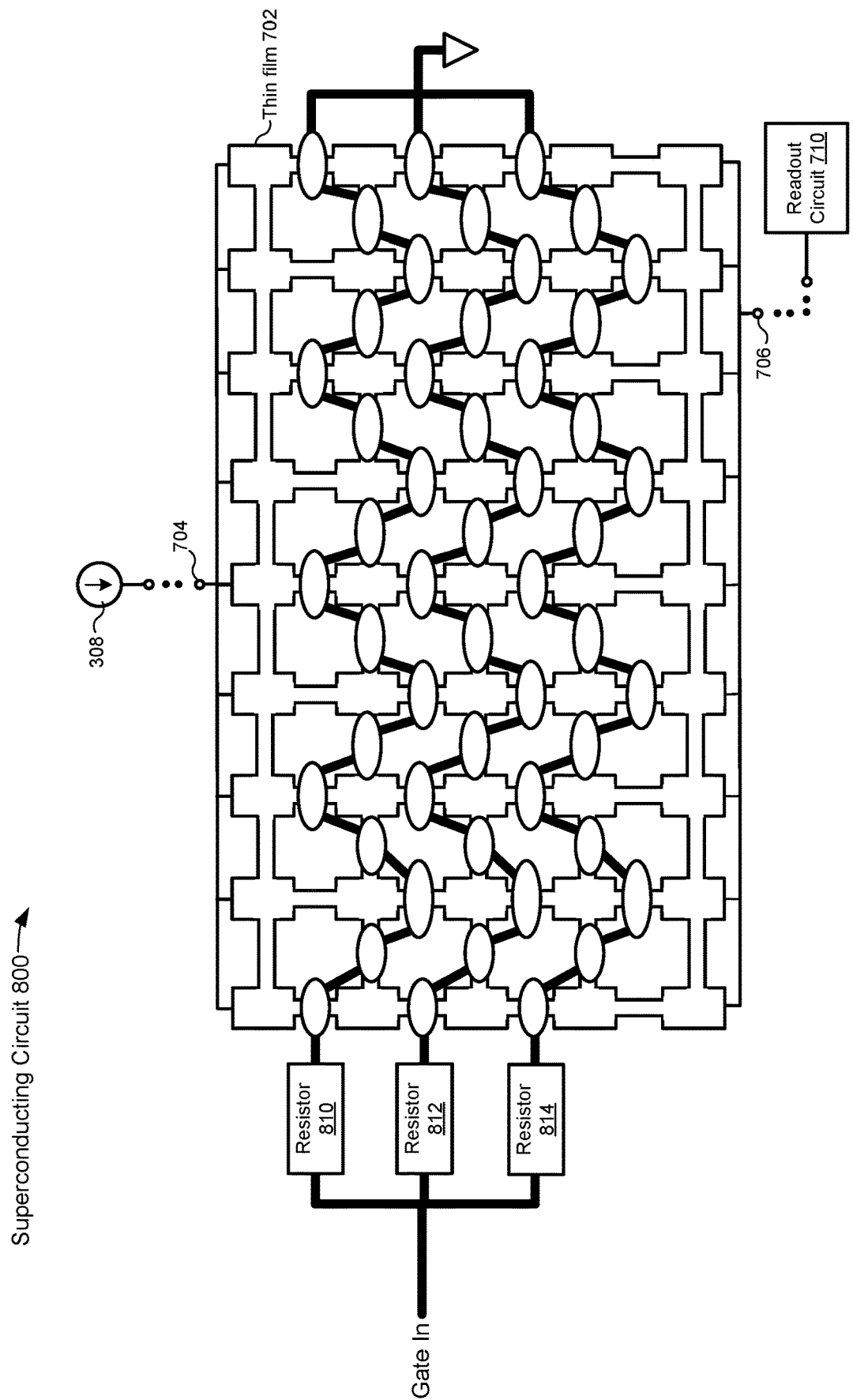
FIG. 8A is a schematic diagram illustrating a representative superconducting circuit in an example programmed state in accordance with some embodiments.

FIG. 8A is a schematic diagram illustrating a superconducting circuit 800 in an example programmed state (e.g., variable capacitor) in accordance with some embodiments. The superconducting circuit 800 includes the superconducting circuit 700 of FIG. 7 and a gate line coupled to three sets of heat sources, each set spanning the width of the thin film 702 (e.g., each set similar to the configuration shown in FIG. 4A and described above). The gate line in FIG. 8A is coupled to each set of heat sources via a resistor. In some embodiments, the resistors 810, 812, and 814 have different respective resistance values (e.g., the resistors operate as a current divider for current provided to the gate line). For example, in accordance with some embodiments, the resistor 812 has a higher resistance value than the resistor 810, and the resistor 814 has a higher resistance value than the resistor 812. Although FIG. 8A shows the heat sources coupled together via the gate line, in some embodiments, the heat sources are independently controlled and/or operated (e.g., are individually programmed to operate concurrently with other heat sources in the same set).

Figure 8B:
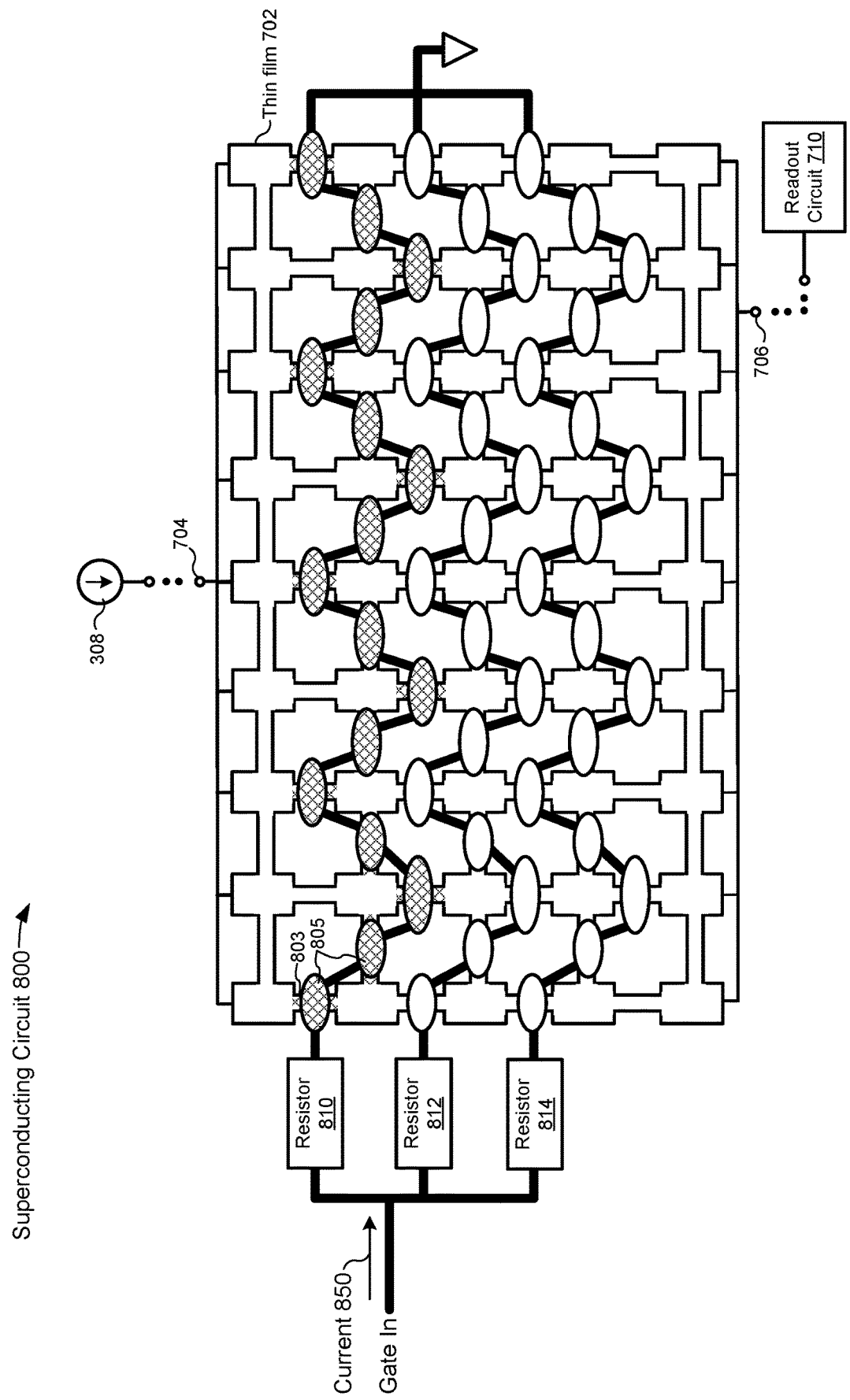
FIGS. 8B-8D are diagrams illustrating representative operating states of the superconducting circuit of FIG. 8A in accordance with some embodiments.
Figure 8C:
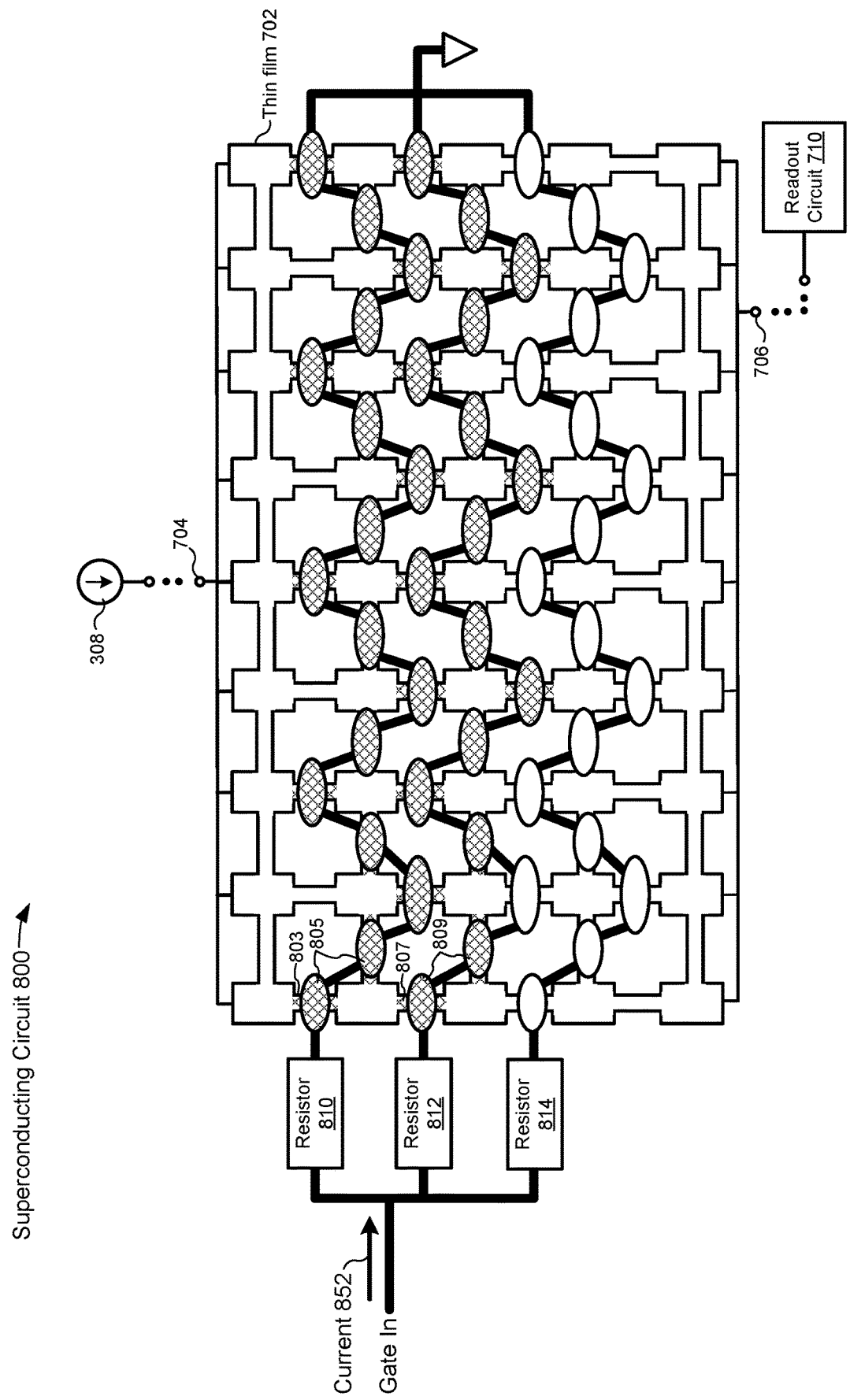
Figure 8D:
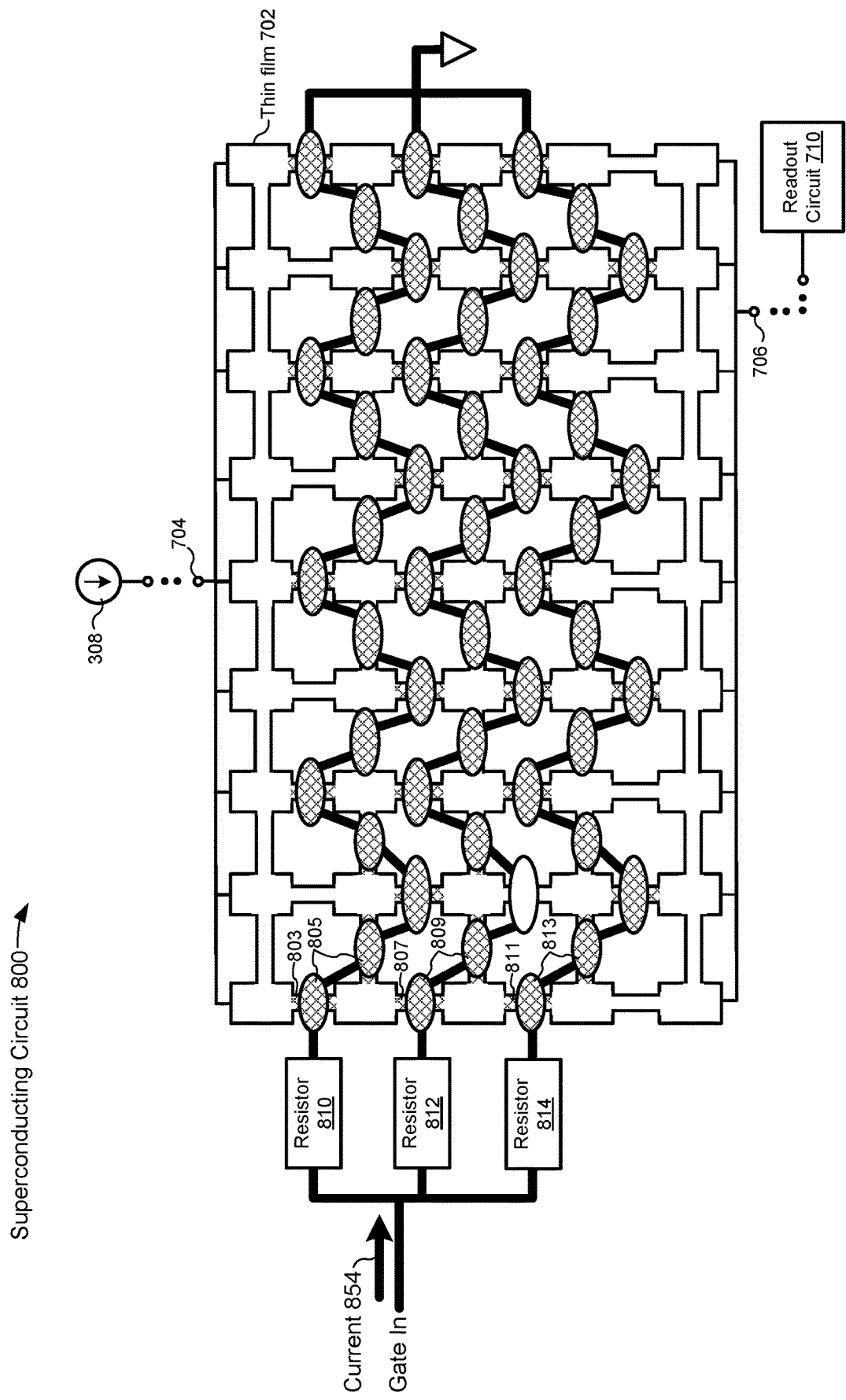

FIGS. 8B-8D are diagrams illustrating representative operating states of the superconducting circuit of FIG. 8A in accordance with some embodiments. FIG. 8B shows a first current, current 850, received at the gate line. FIG. 8B further shows the first set of heat sources 805 supplying sufficient heat to the corresponding set of narrow portions (e.g., narrow portion 803) to transition the narrow portions from the superconducting state to the non-superconducting state. The transition of the first set of narrow portions results in a first capacitance between the current source 308 and the readout circuit 710 of superconducting circuit 800.

FIG. 8C shows a second current, current 852 (e.g., greater than the current 850 in FIG. 8B), received at the gate line. FIG. 8C also shows the first set of heat sources 805 supplying sufficient heat to the corresponding set of narrow portions (e.g., narrow portion 803) to transition the narrow portions from the superconducting state to the non-superconducting state. FIG. 8C further shows the second set of heat sources 809 supplying sufficient heat to the corresponding set of narrow portions (e.g., narrow portion 807) to transition the narrow portions from the superconducting state to the non-superconducting state. The transition of the first set of narrow portions and the second set of narrow portions results in a second capacitance (e.g., less capacitance than the first capacitance of FIG. 8B) between the current source 308 and the readout circuit 710 of superconducting circuit 800.

FIG. 8D shows a third current, current 854 (e.g., greater than the current 852 in FIG. 8C), received at the gate line. FIG. 8D also shows the first set of heat sources 805 supplying sufficient heat to the corresponding set of narrow portions (e.g., narrow portion 803) to transition the narrow portions from the superconducting state to the non-superconducting state. FIG. 8D further shows the second set of heat sources 809 supplying sufficient heat to the corresponding set of narrow portions (e.g., narrow portion 807) to transition the narrow portions from the superconducting state to the non-superconducting state. FIG. 8D further shows the second set of heat sources 813 supplying sufficient heat to the corresponding set of narrow portions (e.g., narrow portion 811) to transition the narrow portions from the superconducting state to the non-superconducting state. The transition of the first set of narrow portions, the second set of narrow portions, and the third set of narrow portions results in a third capacitance (e.g., less capacitance than the second capacitance of FIG. 8C) between the current source 308 and the readout circuit 710.

Figure 8E:
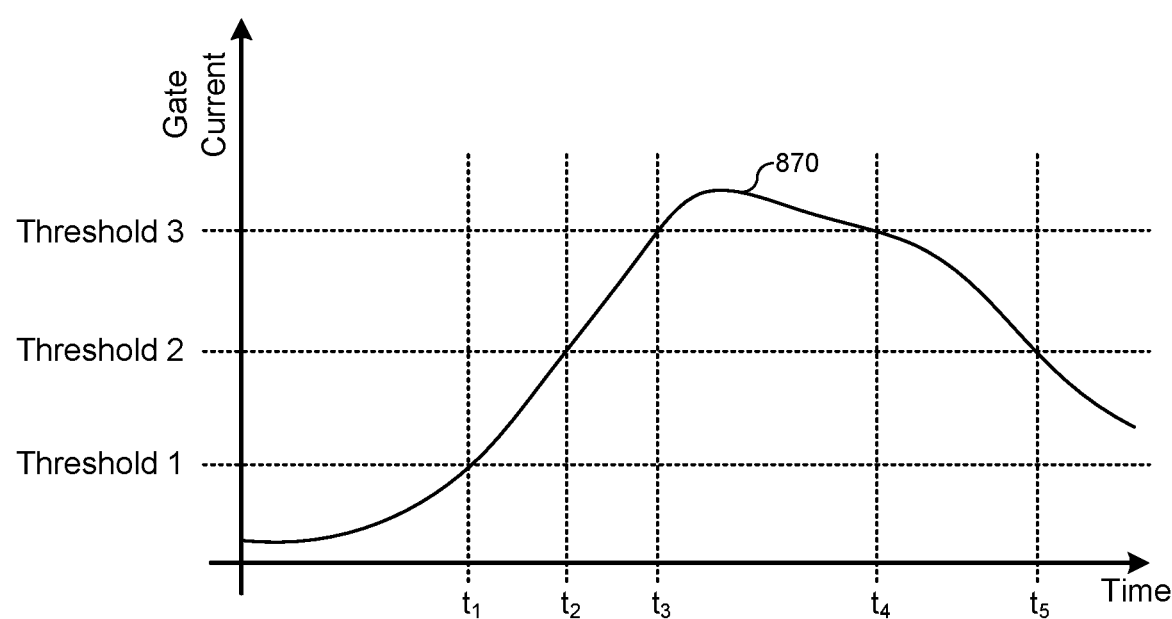
FIGS. 8E-8F are prophetic diagrams illustrating relationships between gate signals and capacitance of the superconducting circuit of FIG. 8A in accordance with some embodiments.
Figure 8F:
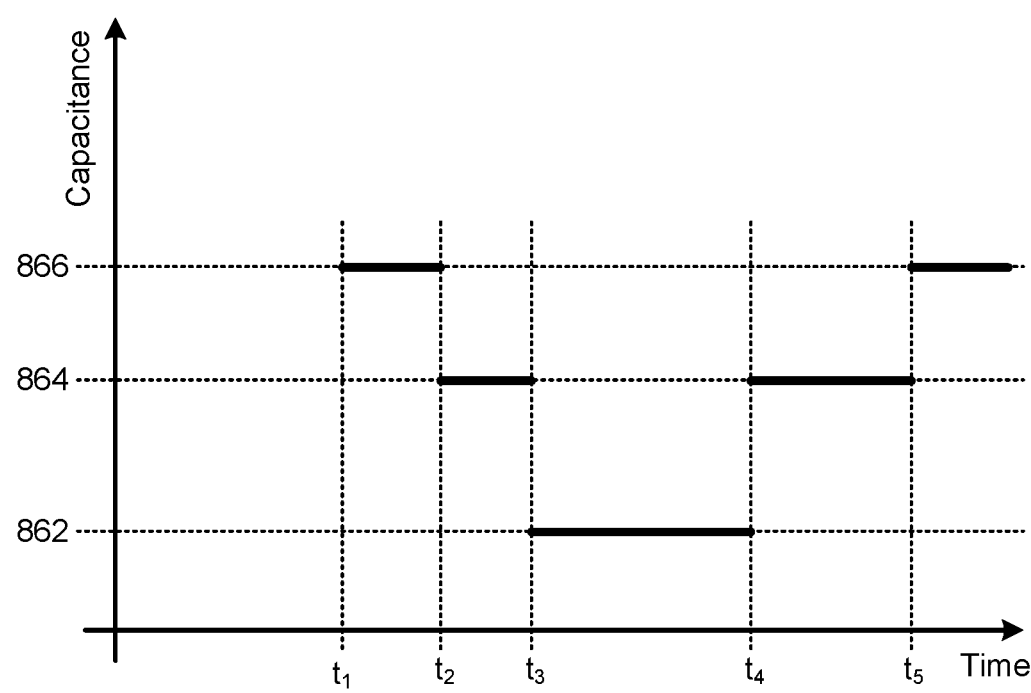

FIGS. 8E-8F are prophetic diagrams illustrating relationships between gate current 870 and capacitance of the superconducting circuit of FIG. 8A in accordance with some embodiments. FIG. 8E shows a gate current 870 changing over time. Specifically, the gate current 870 transitions from below the Threshold 1 to above the Threshold 1 at a first time $t_1$. An example of a current that is between the Threshold 1 and the Threshold 2 is the current 850 in FIG. 8B. As shown in FIG. 8F, a current between the Threshold 1 and the Threshold 2 corresponds to a capacitance 866, e.g., due to the first set of narrow portions transitioning to the non-superconducting state as shown in FIG. 8B. The gate current 870 transitions from below the Threshold 2 to above the Threshold 3 at a second time, $t_2$. An example of a current that is between the Threshold 2 and the Threshold 3 is the current 852 in FIG. 8C. As shown in FIG. 8F, a current between the Threshold 2 and the Threshold 3 corresponds to a capacitance 864 (below the capacitance 866), e.g., due to the first set of narrow portions and the second set of narrow portions transitioning to the non-superconducting state as shown in FIG. 8C. The gate current 870 transitions from below the Threshold 3 to above the Threshold 3 at a third time, $t_3$. An example of a current that is above the Threshold 3 is the current 854 in FIG. 8D. As shown in FIG. 8F, a current above the Threshold 3 corresponds to a capacitance 862 (below the capacitance 864), e.g., due to the first set of narrow portions, the second set of narrow portions, and the third set of narrow portions transitioning to the non-superconducting state as shown in FIG. 8D. The gate current 870 transitions from above the Threshold 3 to below the Threshold 3 at a fourth time, $t_4$, which causes the superconducting circuit 800 to transition to a state in which the capacitance between the current source 308 and the readout circuit 710 of superconducting circuit 800 is the second capacitance 864. The gate current 870 transitions from above the Threshold 2 to below the Threshold 2 at a fifth time, $t_5$, which causes the superconducting circuit 800 to transition to a state in which the capacitance between the current source 308 and the readout circuit 710 of superconducting circuit 800 is the first capacitance 866.

Figure 9A:
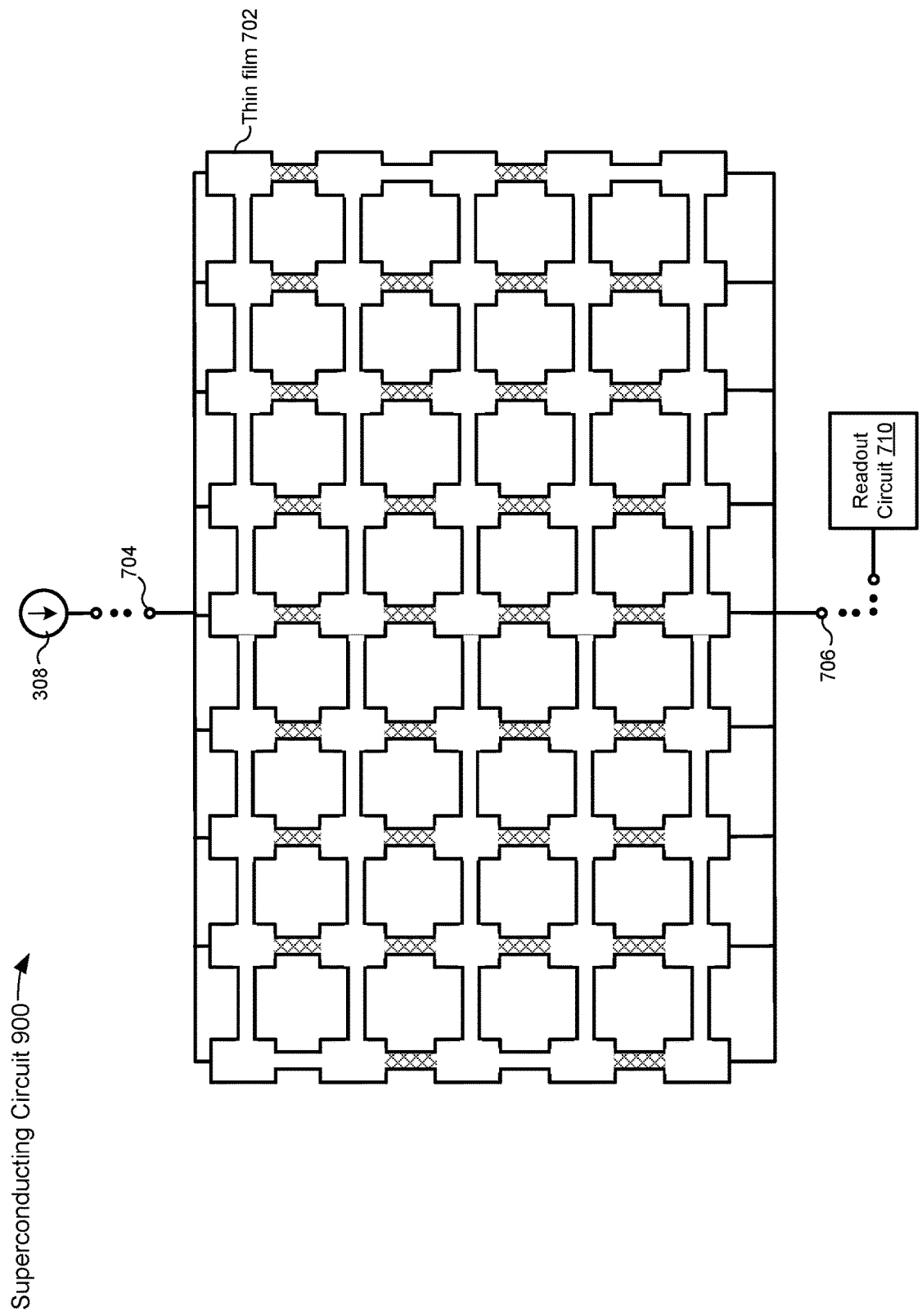
FIGS. 9A-9B are schematic diagrams illustrating a representative superconducting circuit in an example programmed state in accordance with some embodiments.
Figure 9B:
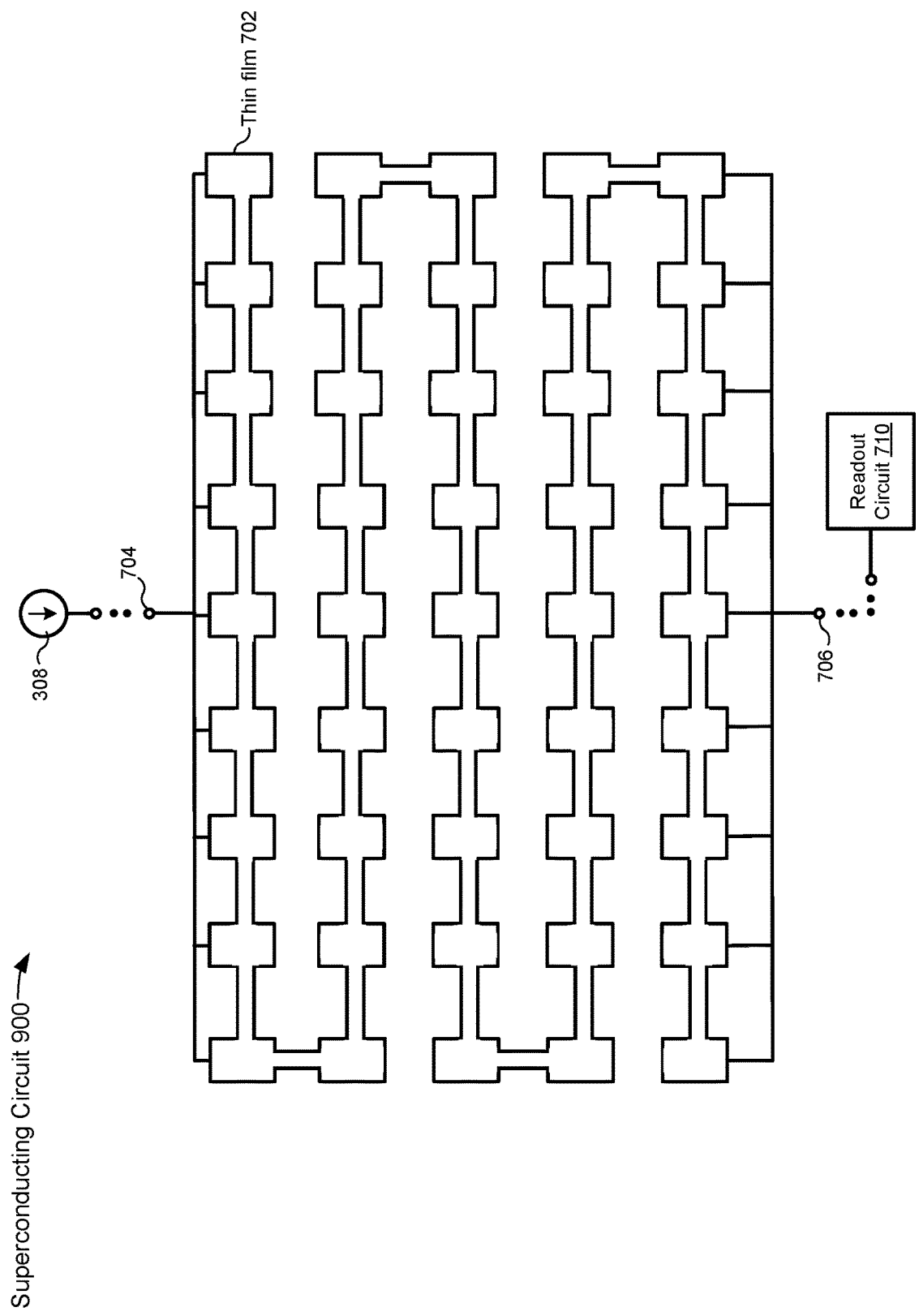

FIGS. 9A-9B are schematic diagrams illustrating a superconducting circuit 900 in an example programmed state (e.g., a selective inductor) in accordance with some embodiments. In FIG. 9A the narrow portions that are shown in a cross-hatch pattern are in a non-superconducting state (e.g., a conductive or insulating state). In FIG. 9B the narrow portions in the non-superconducting states are not shown. In some embodiments, the narrow portions are coupled to heat sources (e.g., heat sources 202 as shown in FIGS. 2, 3, 4A, etc.); and the narrow portions in the non-superconducting states are receiving heat from the corresponding heat sources. In some embodiments, the narrow portions are coupled to strain sources (e.g., piezoelectric sources); and the narrow portions in the non-superconducting states are receiving strain from the corresponding strain sources. The non-superconducting narrow portions result in a relatively long path (as compared to other configurations of the thin film 702) from the current source 308 through the thin film 702 to the readout circuit 710, resulting in relatively higher inductance (compared to other configurations of the thin film). In other configurations of superconducting circuit 900, not shown, by changing which heat or strain sources are enabled and which are disabled, the path from the current source 308 through the thin film 702 to the readout circuit 710 is shorter than the path shown in FIG. 9B, resulting in lower inductance than the configuration shown in FIGS. 9A and 9B. Thus, the inductance of superconducting circuit 900 is selectable by selectively transitioning the narrow portions of superconducting circuit 900 between superconducting and non-superconducting states.

Figure 10A:
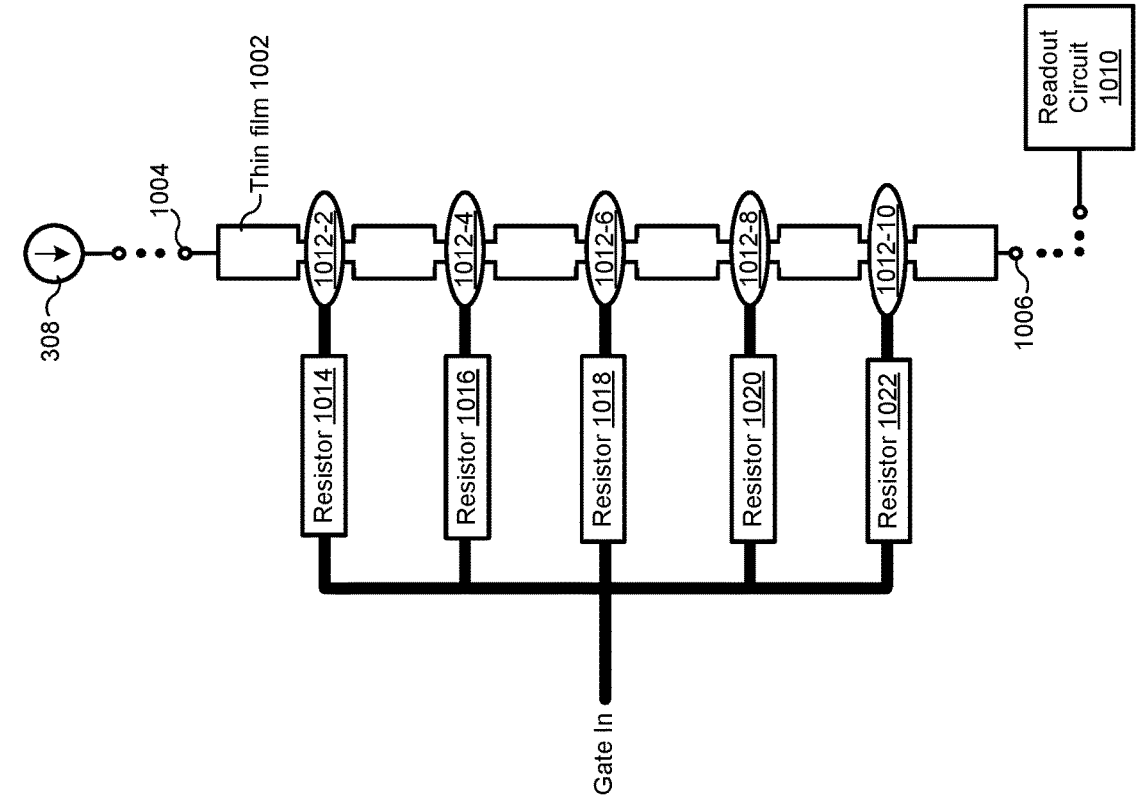
FIG. 10A is a schematic diagram illustrating a representative superconducting circuit in an example programmed state in accordance with some embodiments.

FIG. 10A is a schematic diagram illustrating a superconducting circuit 1000 in an example programmed state (e.g., a variable resistor) in accordance with some embodiments. The superconducting circuit 1000 includes a thin film 1002 having alternating wide portions and narrow portions. The thin film 1002 is coupled at a first terminal 1004 to a current source 308, and is coupled at a second terminal 1006 to a readout circuit 1010. Each narrow portion of the thin film 1002 is coupled to a heat source 1012 (or optionally a piezoelectric source). The heat sources 1012 are coupled to a gate line via a set of resistors, e.g., resistors 1014, 1016, 1018, 1020, and 1022. The resistors 1014-1022 have sequentially ascending resistance values such that the set of resistors operate as a current divider for currents received at the gate line. In some embodiments, rather than coupling the heat sources to the current divider circuitry shown in FIG. 10A, each individual heat source is coupled to a distinct current source.

Figure 10B:
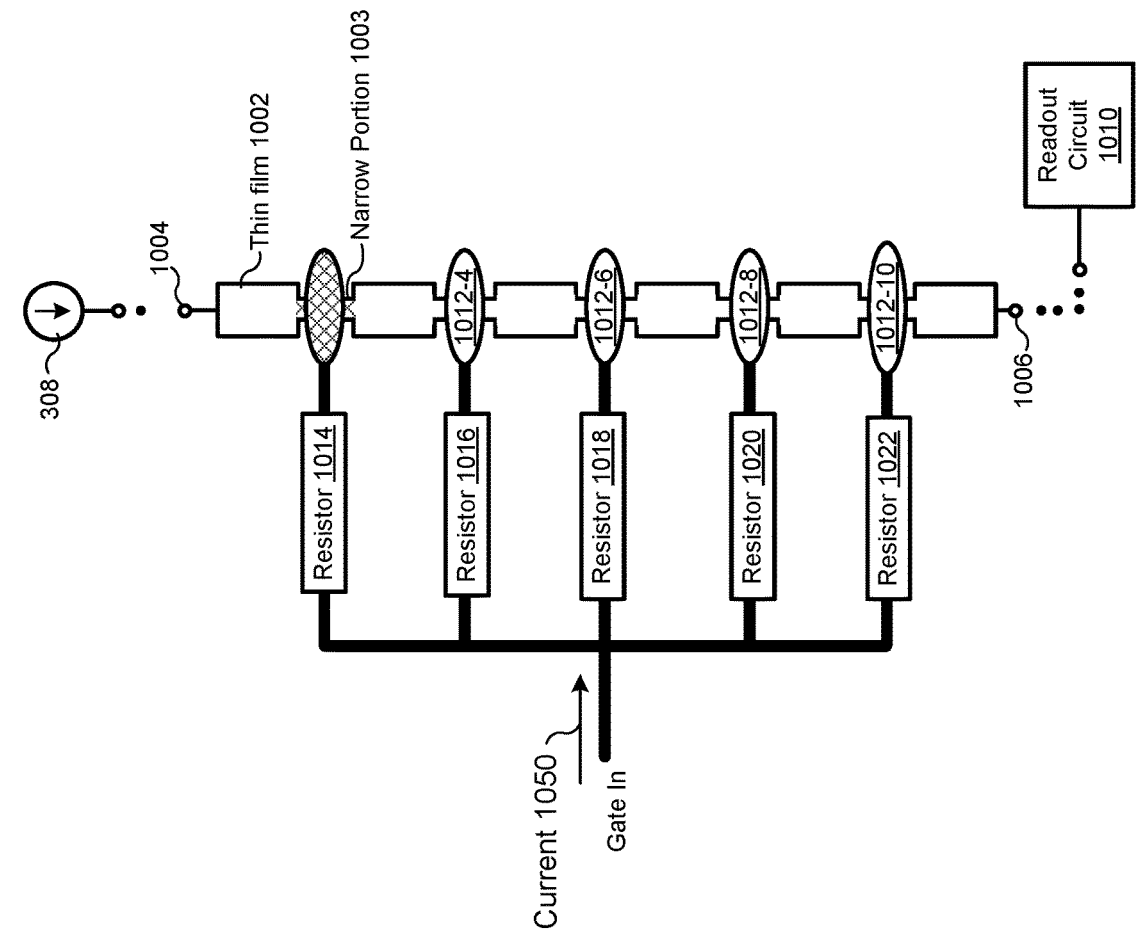
FIGS. 10B-10F are prophetic diagrams illustrating representative operating states of the superconducting circuit of FIG. 10A in accordance with some embodiments.

FIGS. 10B-10F are prophetic diagrams illustrating representative operating states of the superconducting circuit of FIG. 10A in accordance with some embodiments. FIG. 10B shows a first current, current 1050, received at the gate line. FIG. 10B further shows the first heat source 1012-2 supplying sufficient heat to the corresponding narrow portion 1003 to transition the narrow portion 1003 from the superconducting state to the non-superconducting state. The transition of the first narrow portion results in a first resistance between the current source 308 and the readout circuit 1010.

Figure 10C:
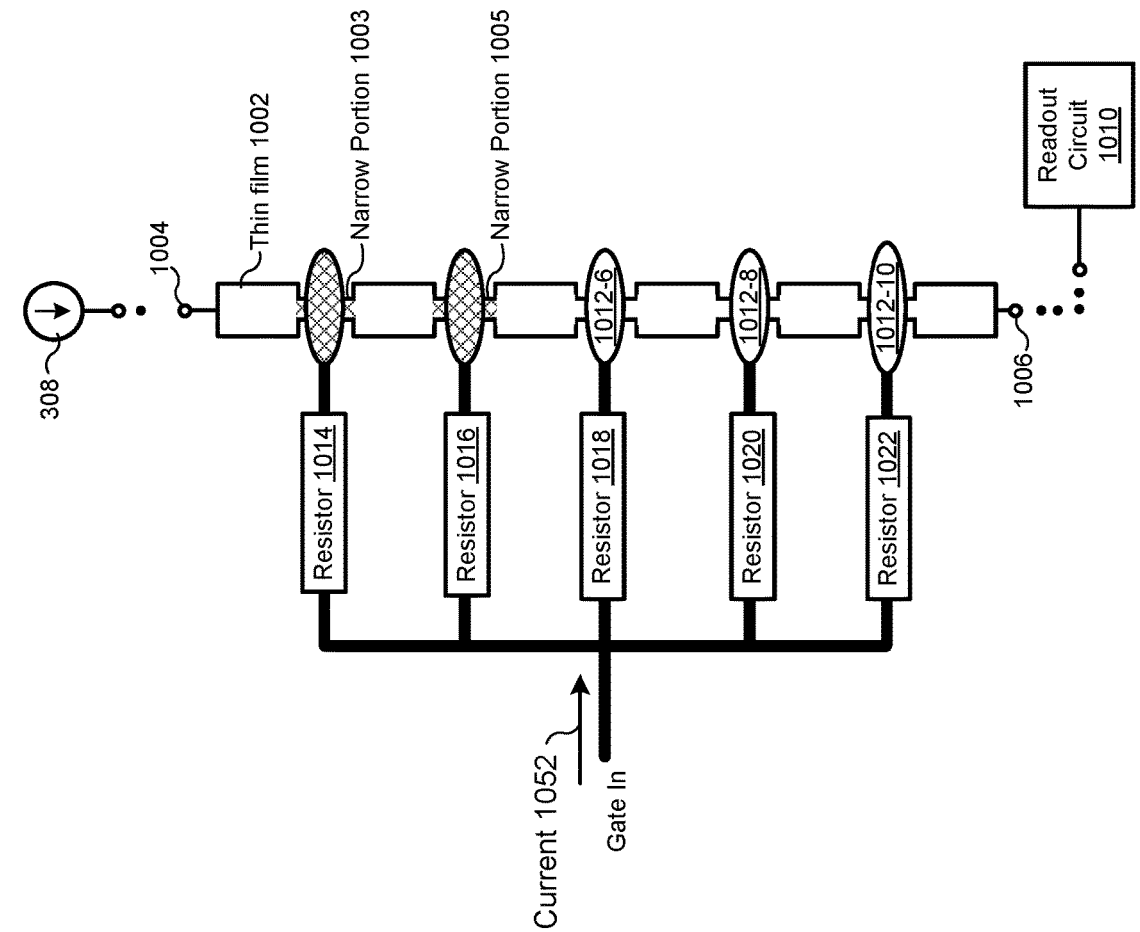

FIG. 10C shows a second current, current 1052, (e.g., greater than the current 1050) received at the gate line. FIG. 10C further shows the heat sources 1012-2 and 1012-4 supplying sufficient heat to the corresponding narrow portions 1003 and 1005 to transition those narrow portions from the superconducting state to the non-superconducting state. The transition of the narrow portions 1003 and 1005 results in a second resistance (e.g., greater than the first resistance) between the current source 308 and the readout circuit 1010.

Figure 10D:
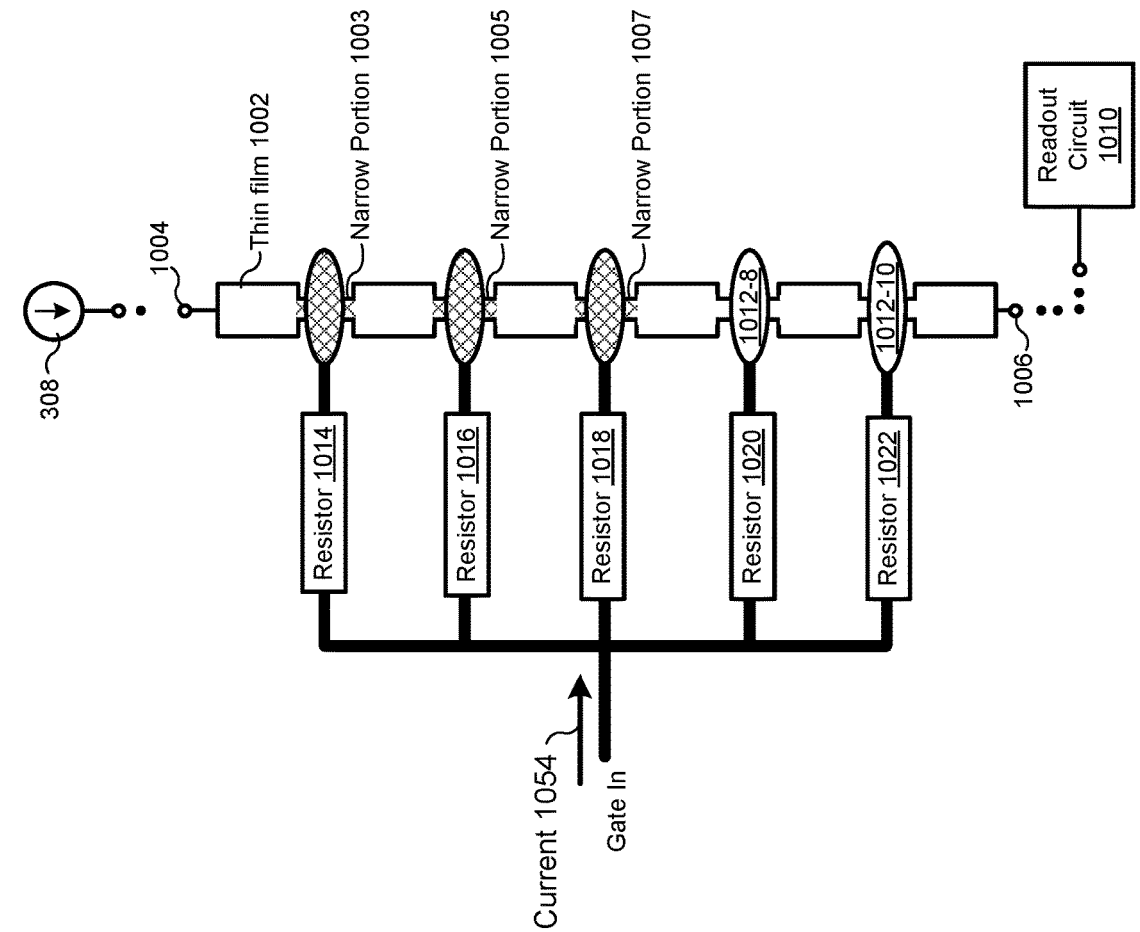

FIG. 10D shows a third current, current 1054, (e.g., greater than the current 1052) received at the gate line. FIG. 10D further shows the heat sources 1012-2 through 1012-6 supplying sufficient heat to the corresponding narrow portions 1003, 1005, and 1007 to transition those narrow portions from the superconducting state to the non-superconducting state. The transition of the narrow portions 1003, 1005, and 1007 results in a third resistance (e.g., greater than the second resistance) between the current source 308 and the readout circuit 1010.

Figure 10E:
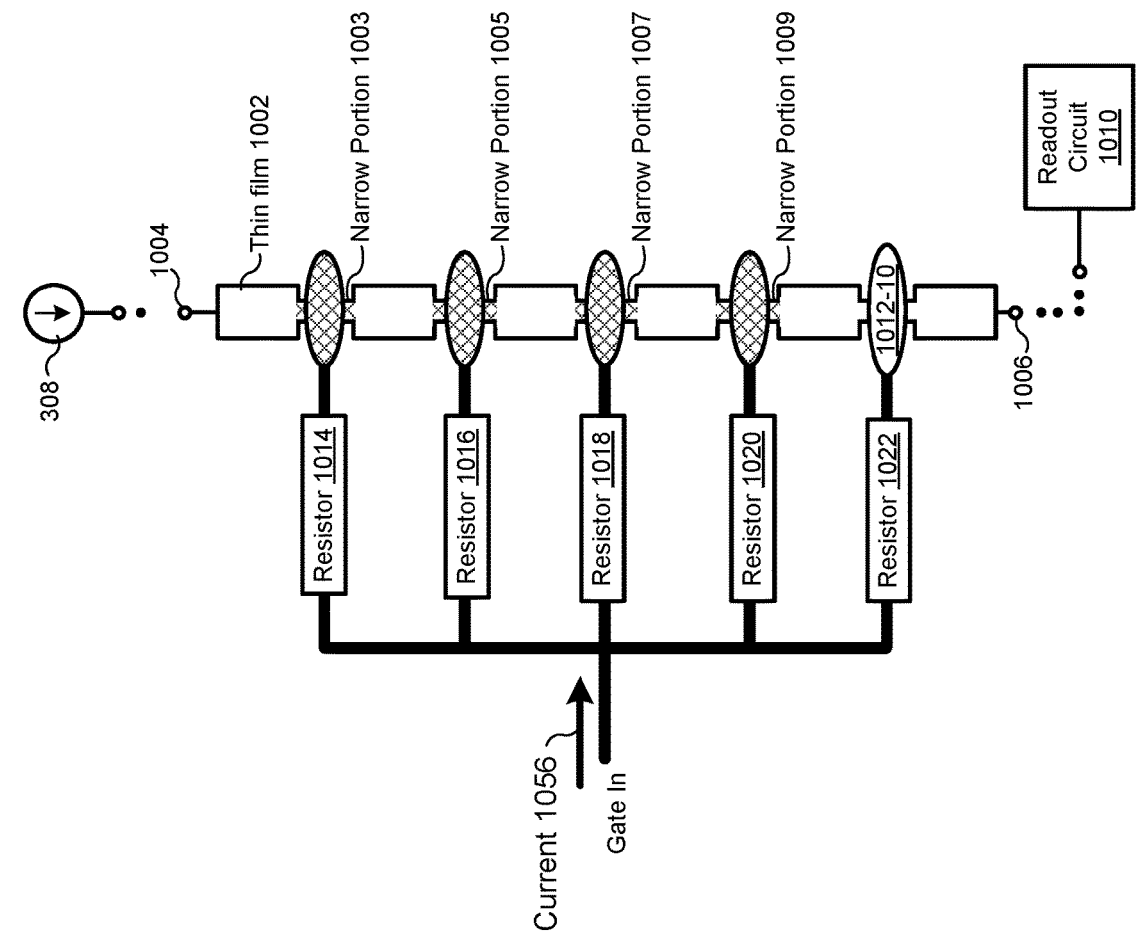

FIG. 10E shows a fourth current, current 1056, (e.g., greater than the current 1054) received at the gate line. FIG. 10E further shows the heat sources 1012-2 through 1012-8 supplying sufficient heat to the corresponding narrow portions 1003, 1005, 1007, and 1009 to transition those narrow portions from the superconducting state to the non-superconducting state. The transition of the narrow portions 1003, 1005, 1007, and 1009 results in a fourth resistance (e.g., greater than the third resistance) between the current source 308 and the readout circuit 1010.

Figure 10F:
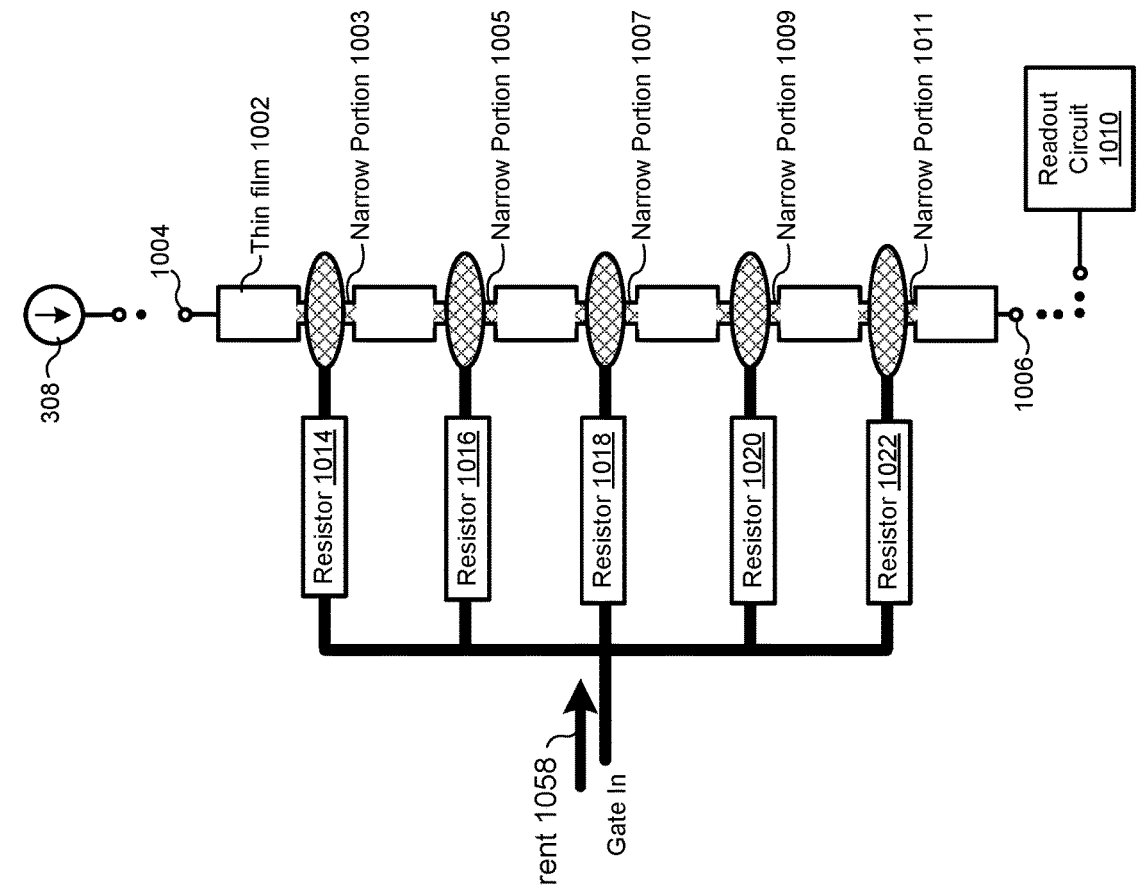

FIG. 10F shows a fifth current, current 1058, (e.g., greater than the current 1056) received at the gate line. FIG. 10F further shows the heat sources 1012-2 through 1012-10 supplying sufficient heat to the corresponding narrow portions 1003, 1005, 1007, 1009, and 1011 to transition those narrow portions from the superconducting state to the non-superconducting state. The transition of the narrow portions 1003, 1005, 1007, 1009, and 1011 results in a fifth resistance (e.g., greater than the fourth resistance) between the current source 308 and the readout circuit 1010. Thus, FIGS. 10B-10F illustrate that the superconducting circuit 1000 operates as a variable resistor based on an amount of gate current supplied.

Figure 10G:
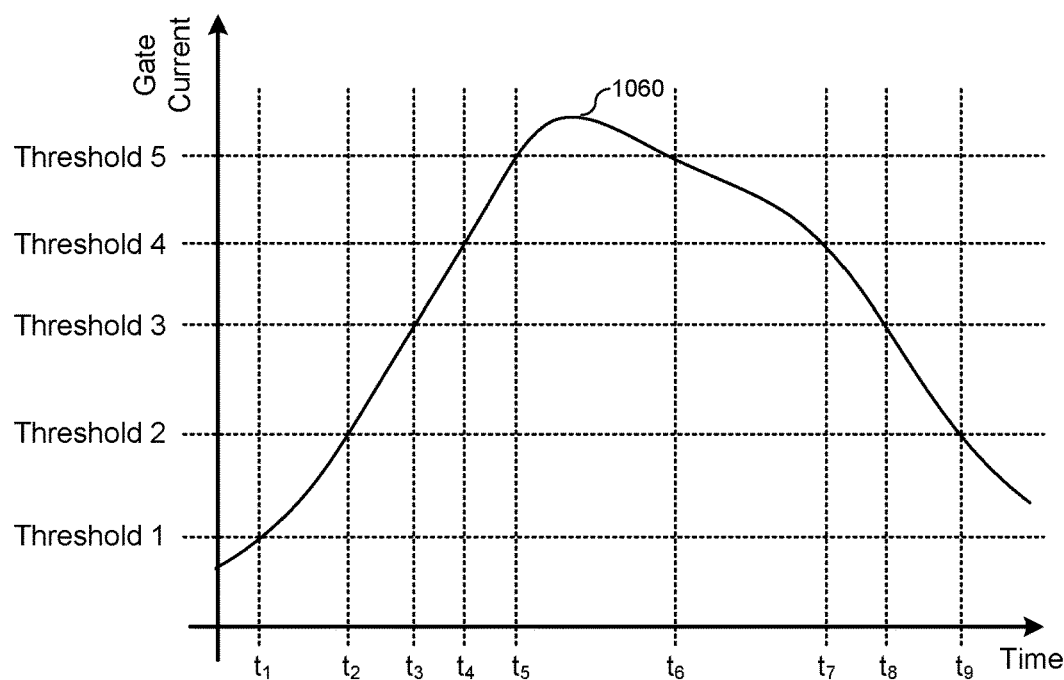
FIGS. 10G-10H are prophetic diagrams illustrating relationships between gate signals and resistance of the superconducting circuit of FIG. 10A in accordance with some embodiments.
Figure 10H:
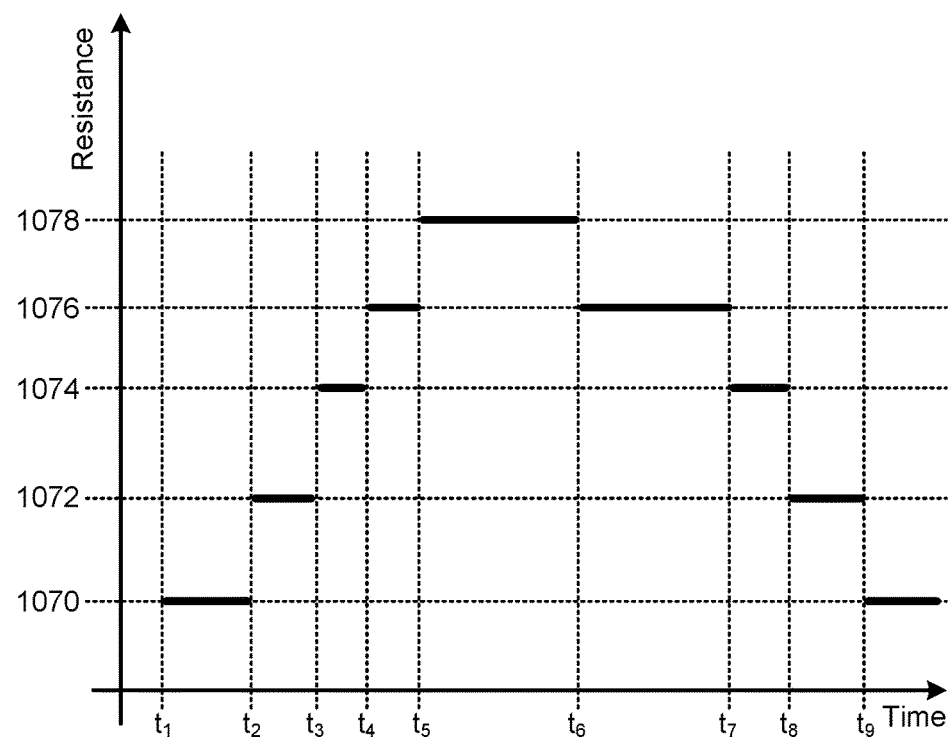

FIGS. 10G-10H are prophetic diagrams illustrating relationships between gate current and resistance of the superconducting circuit of FIG. 10A in accordance with some embodiments. FIG. 10G shows a gate current 1060 changing over time. Specifically, the gate current 1060 transitions from below the Threshold 1 to above the Threshold 1 at a first time $t_1$. An example of a current that is between the Threshold 1 and the Threshold 2 is the current 1050 in FIG. 10B. As shown in FIG. 10H, a current between the Threshold 1 and the Threshold 2 corresponds to a first resistance 1070, e.g., due to the first narrow portion transitioning to the non-superconducting state as shown in FIG. 10B. The gate current 1060 transitions from below the Threshold 2 to above the Threshold 3 at a second time, $t_2$. An example of a current that is between the Threshold 2 and the Threshold 3 is the current 1052 in FIG. 10C. As shown in FIG. 10H, a current between the Threshold 2 and the Threshold 3 corresponds to a second resistance 1072 (above the resistance 1070), e.g., due to the first and the second narrow portions transitioning to the non-superconducting state as shown in FIG. 10C. The gate current 1060 transitions from below the Threshold 3 to above the Threshold 3 at a third time, $t_3$. An example of a current that is between the Threshold 3 and the Threshold 4 is the current 1054 in FIG. 10D. As shown in FIG. 10H, a current between the Threshold 3 and Threshold 4 corresponds to a third resistance 1074 (above the resistance 1072), e.g., due to the first second, and third narrow portions transitioning to the non-superconducting state as shown in FIG. 10D. The gate current 1060 transitions from below the Threshold 4 to above the Threshold 4 at a fourth time, $t_4$. An example of a current that is between the Threshold 4 and the Threshold 5 is the current 1056 in FIG. 10E. As shown in FIG. 10H, a current between the Threshold 4 and the Threshold 5 corresponds to a fourth resistance 1076 (above the resistance 1074), e.g., due to the first second, third, and fourth narrow portions transitioning to the non-superconducting state as shown in FIG. 10E. The gate current 1060 transitions from below the Threshold 5 to above the Threshold 5 at a fifth time, $t_5$. An example of a current that is above the Threshold 5 is the current 1058 in FIG. 10F. As shown in FIG. 10H, a current above the Threshold 5 corresponds to a fifth resistance 1078 (above the resistance 1076), e.g., due to the first second, third, fourth, and fifth narrow portions transitioning to the non-superconducting state as shown in FIG. 10F. The gate current 1060 transitions from above the Threshold 5 to below the Threshold 5 at a sixth time, $t_6$, which causes the superconducting circuit 1000 to transition to a state in which the resistance between the current source 308 and the readout circuit 1010 of superconducting circuit 1000 is the fourth resistance 1076. The gate current 1060 transitions from above the Threshold 4 to below the Threshold 4 at a seventh time, $t_7$, which causes the superconducting circuit 1000 to transition to a state in which the resistance between the current source 308 and the readout circuit 1010 of superconducting circuit 1000 is the third resistance 1074. The gate current 1060 transitions from above the Threshold 3 to below the Threshold 3 at an eighth time, $t_8$, which causes the superconducting circuit 1000 to transition to a state in which the resistance between the current source 308 and the readout circuit 1010 of superconducting circuit 1000 is the second resistance 1072. The gate current 1060 transitions from above the Threshold 2 to below the Threshold 2 at a ninth time, $t_9$, which causes the superconducting circuit 1000 to transition to a state in which the resistance between the current source 308 and the readout circuit 1010 of superconducting circuit 1000 is the first resistance 1070.

The above figures are described with respect to heat sources (e.g., heat sources 202). In some embodiments the heat sources are configured to generate heat in response to a current source, such as a detector component that generates current in response to detecting photon(s). In some embodiments, the heat sources are superconductor components that generate heat while in a non-superconducting state. In some embodiments, the heat sources are resistive elements that generate heat as current flows through them. In some embodiments, one or more of the heat sources is a thermal source configured to adjust a temperature of the corresponding narrow portion to transition the narrow portion from the superconducting state to the non-superconducting state. In some embodiments, one or more of the heat sources is replaced by a strain source (e.g., a piezoelectric source) configured to selectively apply a strain to the corresponding narrow portion sufficient to transition the narrow portion from the superconducting state to the non-superconducting state.

In light of these principles and embodiments, we now turn to certain additional embodiments.

In accordance with some embodiments, a programmable circuit (e.g., superconducting circuit 300, FIG. 3) includes: (1) a superconducting component (e.g., thin film 201) arranged in a multi-dimensional array of alternating narrow and wide portions, the superconducting component having an input terminal at a first end (e.g., terminal 304) and an output terminal at a second end opposite of the first end (e.g., terminal 302); and (2) control circuitry (e.g., heat sources 202) coupled to the narrow portions of the superconducting component, the control circuitry configured to selectively transition the narrow portions between superconducting and non-superconducting states.

In some embodiments: (1) the control circuitry includes heat sources (e.g., heat source 202) coupled to respective narrow portions of the superconducting component; and (2) the control circuitry selectively transitions the narrow portions from the superconducting state to the non-superconducting states by selectively providing heat via the heat sources (e.g., as illustrated in FIG. 6B).

In some embodiments: (A) the control circuitry further includes: (1) a gate terminal (e.g., gate line, FIG. 8A); (2) a first resistor (e.g., resistor 810) coupled between the gate terminal and a first set of heat sources, where the first set of heat sources are coupled to a first set of narrow portions of the superconducting component; and (3) a second resistor (e.g., resistor 812) coupled between the gate terminal and a second set of heat sources, where the second set of heat sources are coupled to a second set of narrow portions of the superconducting component, and where the second resistor has a higher resistance than the first resistor; and (B) where transition of the first set or the second set of narrow portions from the superconducting state to the non-superconducting state prevents current flow from the input terminal to the output terminal (e.g., as illustrated in FIGS. 8B and 8C).

In some embodiments: (1) the programmable circuit further includes a current source coupled to the gate terminal of the control circuitry; (2) the current source is configured to selectively supply to the control circuitry: (a) a first current (e.g., current 850, FIG. 8B) sufficient to transition the first set of narrow portions from the superconducting state to the non-superconducting state and insufficient to transition the second set of narrow portions from the superconducting state to the non-superconducting state; and (b) a second current (e.g., current 852, FIG. 8C) sufficient to transition the first and second sets of narrow portions from the superconducting state to the non-superconducting state. Thus, in these embodiments the programmable circuit operates the superconducting component as a variable capacitor.

In some embodiments, the control circuitry further includes: (1) a gate-in terminal (e.g., gate line, FIG. 6A) coupled to a first heat source (e.g., heat source 202-2), the first heat source thermally-coupled to a first narrow portion of the superconducting component; (2) a bias terminal (e.g., bias line, FIG. 6A); (3) a first resistor (e.g., resistor 610) coupled between the bias terminal and a second heat source (e.g., heat source 202-7), the second heat source thermally-coupled to a second narrow portion of the superconducting component; and (4) a second resistor (e.g., resistor 612) coupled between the bias terminal and a third heat source (e.g., heat source 202-11), the third heat source thermally-coupled to a third narrow portion of the superconducting component, the second resistor having a higher resistance than the first resistor.

In some embodiments: (A) the programmable circuit further includes: (1) a first current source coupled to the gate-in terminal; and (2) a bias current source coupled to the bias terminal; (B) the bias current source is configured to supply a bias current (e.g., bias current 619, FIG. 6B) insufficient, in the absence of current from the first current source, to transition the second narrow portion or the third narrow portion to the non-superconducting state; and (C) the first current source is configured to selectively supply a first current (e.g., current 640, FIG. 6C), where the first current causes the first heat source to supply heat to the first narrow portion, the heat sufficient to transition the first narrow portion from the superconducting state to the non-superconducting state (e.g., as illustrated in FIG. 6C). In some embodiments, transition of the first narrow portion redirects current flowing through the superconductor component to the other narrow portions. In some embodiments, the redirected current causes the other narrow portions in the row to sequentially transition from the superconducting state to the non-superconducting state (e.g., as illustrated in FIGS. 6D-6F). In some embodiments, transition of all of the narrow portions in the row result in current being redirected to a readout circuit (e.g., readout circuit 608). In some embodiments, the current flowing through the superconductor component initially and being redirected to the readout circuit (e.g., current 620) exceeds the current supplied to the gate terminal (e.g., current 640). Thus, in these embodiments the programmable circuit operates the superconducting component as a cascading current amplifier.

In some embodiments: (1) the control circuitry further includes: (A) a gate-in terminal; (B) a first resistor coupled between the gate-in terminal and a first heat source, the first heat source thermally-coupled to a first narrow portion of the superconducting component; (C) a second resistor coupled between the gate-in terminal and a second heat source, the second heat source thermally-coupled to a second narrow portion of the superconducting component, the second resistor having a higher resistance than the first resistor; and (D) a third resistor coupled between the gate-in terminal and a third heat source, the third heat source thermally-coupled to a third narrow portion of the superconducting component, the third resistor having a higher resistance than the second resistor.

In some embodiments, the programmable circuit further includes a first current source coupled to the gate-in terminal (e.g., the gate line, FIG. 10A) and configured to selectively supply to the control circuitry: (a) a first current (e.g., current 1050, FIG. 10B) sufficient to transition the first narrow portion from the superconducting state to the non-superconducting state and insufficient to transition the second and third portions from the superconducting state to the non-superconducting state; (b) a second current (e.g., current 1052, FIG. 10C) sufficient to transition the first and second narrow portions from the superconducting state to the non-superconducting state and insufficient to transition the third portion from the superconducting state to the non-superconducting state; and (c) a third current (e.g., current 1054, FIG. 10D) sufficient to transition the first, second, and third narrow portions from the superconducting state to the non-superconducting state. Thus, in these embodiments the programmable circuit may operate the superconducting component as an analog-to-digital converter (ADC) or a potentiometer.

In some embodiments, the control circuitry includes piezoelectric sources coupled to respective narrow portions of the superconducting component; and the control circuitry transitions the narrow portions from the superconducting state to the non-superconducting states by selectively providing mechanical-strain via the piezoelectric sources.

In accordance with some embodiments, a programmable circuit (e.g., superconducting circuit 400, FIG. 4A) includes: (1) a configurable superconducting component (e.g., thin film 201) having an input terminal (e.g., terminal 304), an output terminal (e.g., terminal 302), and a plurality of gate terminals (e.g., for each narrow portion of the thin film 201); and (2) control circuitry (e.g., heat sources 202) coupled to the superconducting component via the plurality of gate terminals, the control circuitry adapted to selectively adjust capacitance, inductance, and/or resistance of the superconducting component. In some embodiments, the superconducting component includes a multi-dimensional array of alternating narrow and wide portions; and the gate terminals correspond to respective narrow portions of the superconducting component. In some embodiments, activating a gate terminal includes transitioning the narrow portion from a superconducting state to a non-superconducting state (e.g., as described above with respect to FIG. 4A).

In some embodiments, the control circuitry is configured to concurrently activate a subset of the plurality of gate terminals so as to inhibit current flow from the input terminal to the output terminal (e.g., as illustrated in FIGS. 4A-4B). Thus, in these embodiments the programmable circuit operates the superconducting component as a capacitor.

In some embodiments, the control circuitry is configured to selectively activate distinct subsets of the plurality of gate terminals to adjust a capacitance of the superconducting component (e.g., as illustrated in FIGS. 6A-6F).

In some embodiments, the control circuitry is configured to concurrently activate a subset of the plurality of gate terminals so as to increase a path length for current flowing from the input terminal to the output terminal (e.g., as illustrated in FIGS. 9A-9B). Thus, in these embodiments the programmable circuit operates the superconducting component as an inductor. In some embodiments, the control circuitry is configured to selectively activate distinct subsets of the plurality of gate terminals to adjust an inductance of the superconducting component.

In some embodiments, the control circuitry is thermally-coupled to, and electrically-insulated from, the plurality of gate terminals (e.g., as described above with respect to heat sources 202).

In some embodiments, the programmable circuit further includes a current source (e.g., the current source 308, FIG. 3) coupled to the input terminal of the superconducting component, the current source adapted to supply a bias current to the superconducting component. In some embodiments, the bias current is adapted to maintain the superconducting component in a superconducting state in the absence of activation of any of the gate terminals. In some embodiments, the programmable circuit further includes an output component (e.g., the readout circuit 306, FIG. 3) coupled to the output terminal of the superconducting component.

Although some of various drawings illustrate a number of logical stages in a particular order, stages that are not order dependent may be reordered and other stages may be combined or broken out. While some reordering or other groupings are specifically mentioned, others will be obvious to those of ordinary skill in the art, so the ordering and groupings presented herein are not an exhaustive list of alternatives. Moreover, it should be recognized that the stages could be implemented in hardware, firmware, software or any combination thereof.

It will also be understood that, although the terms first, second, etc. are, in some instances, used herein to describe various elements, these elements should not be limited by these terms. These terms are only used to distinguish one element from another. For example, a first current could be termed a second current, and, similarly, a second current could be termed a first current, without departing from the scope of the various described embodiments. The first current and the second current are both currents, but they are not the same condition unless explicitly stated as such.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" is, optionally, construed to mean "when" or "upon" or "in response to determining" or "in response to detecting" or "in accordance with a determination that," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]" or "in accordance with a determination that [a stated condition or event] is detected," depending on the context.

The foregoing description, for purpose of explanation, has been described with reference to specific embodiments. However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

What is claimed is:

1. A programmable circuit, comprising:
   a superconducting component arranged in a multi-dimensional array of alternating narrow and wide portions, the superconducting component having an input terminal at a first end and an output terminal at a second end opposite of the first end; and
   control circuitry coupled to the narrow portions of the superconducting component, the control circuitry configured to selectively transition the narrow portions between superconducting and non-superconducting states, wherein:
      the control circuitry includes:
         heat sources coupled to respective narrow portions of the superconducting component;
         a gate terminal;
         a first resistor coupled between the gate terminal and a first set of heat sources, wherein the first set of heat sources are coupled to a first set of narrow portions of the superconducting component; and
         a second resistor coupled between the gate terminal and a second set of heat sources, wherein the second set of heat sources are coupled to a second set of narrow portions of the superconducting component, and the second resistor has a higher resistance than the first resistor;
      wherein the control circuitry selectively transitions the narrow portions from the superconducting state to the non-superconducting state by selectively providing heat via the heat sources; and
      wherein transition of the first set or the second set of narrow portions from the superconducting state to the non-superconducting state prevents current flow from the input terminal to the output terminal.

2. The programmable circuit of claim 1, further comprising a current source coupled to the gate terminal of the control circuitry;
   wherein the current source is configured to selectively supply to the control circuitry:
      a first current sufficient to transition the first set of narrow portions from the superconducting state to the non-superconducting state and insufficient to transition the second set of narrow portions from the superconducting state to the non-superconducting state; and
      a second current sufficient to transition the first and second sets of narrow portions from the superconducting state to the non-superconducting state.

3. The programmable circuit of claim 1, wherein the control circuitry further comprises:
   a gate-in terminal coupled to a first heat source, the first heat source thermally-coupled to a first narrow portion of the superconducting component;
   a bias terminal;

a first bias resistor coupled between the bias terminal and a second heat source, the second heat source thermally-coupled to a second narrow portion of the superconducting component; and a second bias resistor coupled between the bias terminal and a third heat source, the third heat source thermally-coupled to a third narrow portion of the superconducting component, the second resistor having a higher resistance than the first resistor.

4. The programmable circuit of claim 3, further comprising:

a first current source coupled to the gate-in terminal; and
a bias current source coupled to the bias terminal;
wherein the bias current source is configured to supply a bias current insufficient, in the absence of current from the first current source, to transition the second narrow portion or the third narrow portion to the non-superconducting state; and
wherein the first current source is configured to selectively supply a first current, wherein the first current causes the first heat source to supply heat to the first narrow portion, the heat sufficient to transition the first narrow portion from the superconducting state to the non-superconducting state.

5. The programmable circuit of claim 1, wherein the control circuitry comprises piezoelectric sources coupled to respective narrow portions of the superconducting component; and wherein the control circuitry selectively transitions the narrow portions from the superconducting state to the non-superconducting states by selectively providing mechanical-strain via the piezoelectric sources.

6. A programmable circuit, comprising:

a superconducting component arranged in a multi-dimensional array of alternating narrow and wide portions, the superconducting component having an input terminal at a first end and an output terminal at a second end opposite of the first end; and control circuitry coupled to the narrow portions of the superconducting component, the control circuitry configured to selectively transition the narrow portions between superconducting and non-superconducting states, wherein:

the control circuitry comprises heat sources coupled to respective narrow portions of the superconducting component;

the control circuitry selectively transitions the narrow portions from the superconducting state to the non-superconducting states by selectively providing heat via the heat sources; and the control circuitry further comprises:
a gate-in terminal;
a first resistor coupled between the gate-in terminal and a first heat source, the first heat source thermally-coupled to a first narrow portion of the superconducting component;
a second resistor coupled between the gate-in terminal and a second heat source, the second heat source thermally-coupled to a second narrow portion of the superconducting component, the second resistor having a higher resistance than the first resistor; and
a third resistor coupled between the gate-in terminal and a third heat source, the third heat source thermally-coupled to a third narrow portion of the superconducting component, the third resistor having a higher resistance than the second resistor.

7. The programmable circuit of claim 6, further comprising:

a first current source coupled to the gate-in terminal and configured to selectively supply to the control circuitry:
a first current sufficient to transition the first narrow portion from the superconducting state to the non-superconducting state and insufficient to transition the second and third narrow portions from the superconducting state to the non-superconducting state;
a second current sufficient to transition the first and second narrow portions from the superconducting state to the non-superconducting state and insufficient to transition the third narrow portion from the superconducting state to the non-superconducting state; and
a third current sufficient to transition the first, second, and third narrow portions from the superconducting state to the non-superconducting state.

8. A programmable circuit, comprising:

a configurable superconducting component having an input terminal, an output terminal, and a plurality of gate terminals; and control circuitry coupled to the configurable superconducting component via the plurality of gate terminals, the control circuitry adapted to selectively adjust capacitance, inductance, or resistance of the configurable superconducting component, wherein:

the control circuitry includes:
heat sources coupled to gate terminals of the plurality of gate terminals:
a gate-in terminal;
a first resistor coupled between the gate-in terminal and a first set of heat sources, wherein the first set of heat sources are coupled to a first set of gate terminals of the plurality of gate terminals; and
a second resistor coupled between the gate-in terminal and a second set of heat sources, wherein the second set of heat sources are coupled to a second set of gate terminals of the plurality of gate terminals, and the second resistor has a higher resistance than the first resistor;

wherein the control circuitry selectively transitions the gate terminals from a superconducting state to a non-superconducting state by selectively providing heat via the heat sources; and wherein transition of the first set or the second set of gate terminals from the superconducting state to the non-superconducting state prevents current flow from the input terminal to the output terminal.

9. The programmable circuit of claim 8, wherein the configurable superconducting component comprises a multi-dimensional array of alternating narrow and wide portions; and wherein the gate terminals correspond to respective narrow portions of the configurable superconducting component.

10. The programmable circuit of claim 9, wherein the control circuitry is configured to concurrently activate a subset of the plurality of gate terminals so as to inhibit current flow from the input terminal to the output terminal.

11. The programmable circuit of claim 10, wherein the control circuitry is configured to selectively activate distinct subsets of the plurality of gate terminals to adjust a capacitance of the configurable superconducting component.

12. The programmable circuit of claim 9, wherein the control circuitry is configured to concurrently activate a subset of the plurality of gate terminals so as to increase a path length for current flowing from the input terminal to the output terminal.

13. The programmable circuit of claim 12, wherein the control circuitry is configured to selectively activate distinct subsets of the plurality of gate terminals to adjust an inductance of the configurable superconducting component.

14. The programmable circuit of claim 8, wherein the control circuitry is thermally-coupled to, and electrically-insulated from, the plurality of gate terminals.

15. The programmable circuit of claim 8, further comprising a current source coupled to the input terminal of the configurable superconducting component, the current source adapted to supply a bias current to the configurable superconducting component.

16. The programmable circuit of claim 8, further comprising an output component coupled to the output terminal of the configurable superconducting component.

\* \* \* \* \*